United States Patent
Toshikiyo et al.

(10) Patent No.: US 7,667,286 B2
(45) Date of Patent: Feb. 23, 2010

(54) LIGHT-COLLECTING DEVICE, SOLID-STATE IMAGING APPARATUS AND METHOD OF MANUFACTURING THEREOF

(75) Inventors: Kimiaki Toshikiyo, Osaka (JP);
Kazutoshi Onozawa, Osaka (JP);
Daisuke Ueda, Osaka (JP); Taku Goubara, Kyoto (JP)

(73) Assignee: Panasonic Corporation, Osaka (JP)

( * ) Notice: Subject to any disclaimer, the term of this patent is extended or adjusted under 35 U.S.C. 154(b) by 335 days.

(21) Appl. No.: 11/658,666

(22) PCT Filed: Sep. 1, 2005

(86) PCT No.: PCT/JP2005/016024

§ 371 (c)(1),
(2), (4) Date: Jan. 26, 2007

(87) PCT Pub. No.: WO2006/025496

PCT Pub. Date: Mar. 9, 2006

(65) Prior Publication Data

US 2008/0272454 A1 Nov. 6, 2008

(30) Foreign Application Priority Data

Sep. 1, 2004 (JP) .............................. 2004-254733

(51) Int. Cl.
*H01L 31/0232* (2006.01)
(52) U.S. Cl. ...................... 257/435; 257/432; 257/443; 257/294; 257/E31.127; 257/E31.13; 438/69; 438/71

(58) Field of Classification Search ................. 257/435, 257/432, 443, 294, E31.127, E31.13; 438/69, 438/71
See application file for complete search history.

(56) References Cited

U.S. PATENT DOCUMENTS 4,994,664 A 2/1991 Veldkamp
5,561,558 A 10/1996 Shiono et al.
(Continued)

FOREIGN PATENT DOCUMENTS

EP 0 809 124 11/1997
(Continued)

OTHER PUBLICATIONS

Partial English translations of JP 2001-108812 and JP 2005-084485 which were previously cited in the IDS filed Jan. 26, 2007.

*Primary Examiner*—Tu-Tu V Ho
(74) *Attorney, Agent, or Firm*—Wenderoth, Lind & Ponack, L.L.P.

(57) ABSTRACT

A high sensitive solid-state imaging apparatus which corresponds to an optical system has a short focal length (an optical system having a large incident angle θ). Each pixel (2.8 mm square in size) includes a distributed refractive index lens, a color filter for green, Al wirings, a signal transmitting unit, a planarized layer, a light-receiving element (Si photodiode), and an Si substrate. The concentric circle structure of the distributed index lens is made of four types of materials having different refractive indexes such as $TiO_2$ (n=2.53), SiN (n=2.53), $SiO_2$ (n=2.53), and air (n=1.0). In the concentric structure, a radial difference of outer peripheries of adjacent circular light-transmitting films is 100 nm. Furthermore, the film thickness is 0.4 vm.

25 Claims, 27 Drawing Sheets

U.S. PATENT DOCUMENTS

| | | |
|---|---|---|
| 5,696,371 A | 12/1997 | Meyers |
| 5,978,139 A * | 11/1999 | Hatakoshi et al. ............ 359/565 |
| 6,927,915 B2 | 8/2005 | Nakai |
| 6,947,215 B2 | 9/2005 | Hoshi |
| 2002/0117671 A1* | 8/2002 | Tateishi ........................ 257/72 |
| 2003/0197210 A1* | 10/2003 | Uchida ........................ 257/294 |
| 2003/0231395 A1 | 12/2003 | Nakai |
| 2004/0248337 A1* | 12/2004 | Yan et al. ...................... 438/64 |
| 2005/0023434 A1* | 2/2005 | Yacoubian ................. 250/200 |
| 2005/0061950 A1* | 3/2005 | Jiang et al. ............... 250/208.1 |
| 2005/0122593 A1* | 6/2005 | Johnson ..................... 359/650 |

FOREIGN PATENT DOCUMENTS

| | | |
|---|---|---|
| JP | 5-251673 | 9/1993 |
| JP | 10-54935 | 2/1998 |
| JP | 2000-39503 | 2/2000 |
| JP | 2001-108812 | 4/2001 |
| JP | 2001-196568 | 7/2001 |
| JP | 2004-20957 | 1/2004 |
| JP | 2004-139001 | 5/2004 |
| JP | 2005-84485 | 3/2005 |

\* cited by examiner

FIG. 29A
FIG. 29B
FIG. 29C
FIG. 29D
FIG. 29E
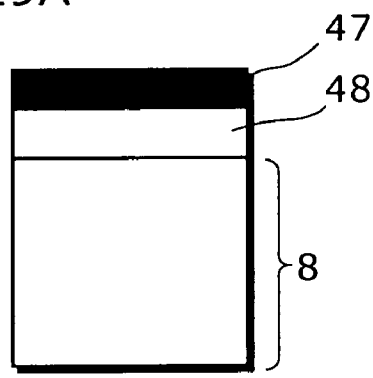
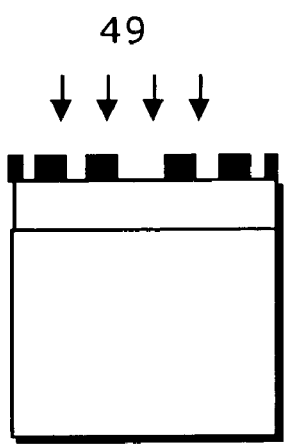
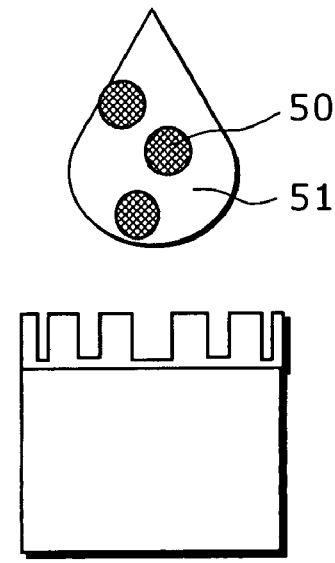
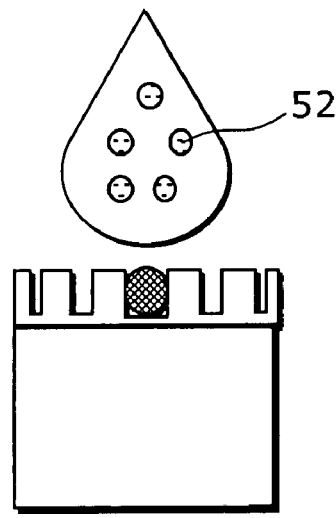
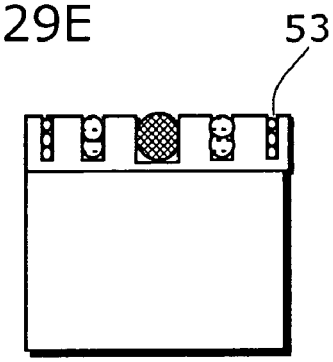

Phase modulation

LIGHT-COLLECTING DEVICE, SOLID-STATE IMAGING APPARATUS AND METHOD OF MANUFACTURING THEREOF

TECHNICAL FIELD

The present invention relates to a light-collecting device and a solid-state imaging apparatus that are used for a digital camera and the like, and a manufacturing method thereof, and particularly to a light-collecting device having light-transmitting films which form a concentric structure.

BACKGROUND ART

Along with the widespread use of a digital camera, e.g. a camera-equipped cell phone and the like, the market for solid-state imaging apparatuses has been remarkably developed. In this flow of development, needs have changed to the development of a highly sensitive and a high pixel solid-state imaging apparatus. In recent years, following the development of a thin digital still camera and a thin cell phone, there is an increasing need for thinning the camera portion. In other words, a lens used for the camera portion has a short focal length, which means that light enters a solid-state imaging apparatus with a wide angle (a wide angle measured from a vertical axis of an incidence plane of the solid-state imaging apparatus).

At present, in a charged-coupled device (CCD) and a metal oxide semiconductor (MOS) imaging sensor that are commonly used as solid-state imaging apparatuses, semiconductor integrated circuits having plural light-receiving portions are arranged in a two-dimensional array, in which an optical signal from an object is converted into an electric signal.

The sensitivity of the solid-state imaging apparatus is defined based on the amount of output current of a light-receiving element to the amount of incident light. Therefore, leading the incident light reliably into the light-receiving element is an important factor for the improvement of sensitivity.

FIG. 4 is a diagram showing an example of a conventional fundamental structure of a general pixel. As shown in FIG. 4, light 59 (light indicated by dashed lines) which enters vertically into a microlens 61 is dispersed into colors through one of red (R), green (G), and blue (B) color filters 2, and then converted into an electric signal by a light-receiving unit 6. Since relatively high light-condensing efficiency can be obtained, this microlens 61 is used in almost all solid-state imaging apparatuses.

An example of a structure in which a lens of each pixel is asymmetrically arranged in the solid-state imaging apparatus using the microlenses has been suggested (e.g. refer to Japanese Laid-Open Patent Application No. 2001-196568 (JP'568). JP'568 discloses an embodiment in which oblique incident light can be introduced to a sensing unit.

Furthermore, various technologies are disclosed as a solid-state imaging apparatus using Fresnel lenses (e.g. refer to Japanese Laid-Open Patent Application No. 2000-39503 (JP'503) and Japanese Laid-Open Patent Application No. 5-251673 (JP'673).

In the technology disclosed in JP'503, a lens is made up of multiple layers which have different refractive indexes and are shaped into concentric circles, and the center part has the highest refractive index as the refractive index decreases towards the peripheral part of the concentric circle structure. Furthermore, in the technology disclosed in the JP'673, a thickness distribution type lens and a distributed refractive index type lens which has a consecutive refractive index distribution through doping are used.

Patent Reference 1: Japanese Laid-Open Patent Application No. 2001-196568
Patent Reference 2: Japanese Laid-Open Patent Application No. 2000-39503
Patent Reference 3: Japanese Laid-Open Patent Application No. 5-251673

To develop a solid-state imaging apparatus corresponding to a wide angle incident, it is necessary to lead the incident light incoming with a particular angle reliably to a light-receiving element.

However, in the microlens, the light-condensing efficiency decreases as the incident angle increases. In other words, as shown in FIG. 4, while the light 59 incoming vertically into the microlens 61 can be condensed very efficiently, the light-condensing efficiency for oblique incident light 60 incoming diagonally (light indicated by solid lines) into the lens decreases. This is because the oblique incident light 60 is blocked by Al wirings 3 in a pixel so that it cannot reach up to the light-receiving element 6.

As previously described, the solid-state imaging apparatus is made up of multiple pixels that are arranged in a two dimensional array. Therefore, in the case of incident light with a spread angle, the angle of incidence differs between the central pixels and the peripheral pixels (see FIG. 1). As a result, the light-condensing efficiency of the peripheral pixels decreases more than that of the central pixels.

FIG. 2 is a diagram showing an example of a conventional structure of a pixel positioned in the periphery. The incident angle of the incident light is large at pixels in the periphery. Therefore, the improvement of the light-condensing efficiency is sought by displacing (shrinking) electric wiring portions toward an inward direction of the center of the solid-state imaging apparatus.

FIG. 3 is a diagram showing a dependency on incident angles of the light-condensing efficiency in the conventional solid-state imaging apparatus using microlens. As shown in FIG. 3, it can be seen that the light with an incident angle up to 20° can be condensed highly efficiently. However, the light-condensing efficiency rapidly decreases as the incident angle becomes higher than 20°. As a result, currently, the amount of light condensed in the peripheral pixels is about 40 percent of that in the central pixels, and the sensitivity of the entire pixels is limited by the sensitivity of the peripheral pixels. This value further decreases along with the decrease in the pixel size so that its application to an optical system with a short focal length such as a small camera becomes very difficult. Furthermore, in a manufacturing method thereof, there is a problem that further circuit shrinking cannot be realized.

In addition, in the case where finely shaped steps such as Fresnel lens shapes are found on the surface of the solid-state imaging apparatus, there is a problem that, especially, dusts from dicing processing are deposited in a shape of finely shaped steps when the solid-state imaging apparatus is manufactured.

Furthermore, in the case where finely shaped steps such as Fresnel lens shapes are found on the surface of the solid-state imaging apparatus, a color filter cannot be placed on top of the light-collecting device.

Accordingly, considering the aforementioned problems, it is an object of the present invention to provide an optical device structure which can condense light incoming with a higher angle than the existing microlens, and to provide a structure which does not cause a problem of dust deposition, in order to realize a solid-state imaging apparatus applicable to an optical system (an optical system with a high incident angle θ) with a short focal length for a thin camera.

In order to solve the aforementioned problem, a light-collecting device according to the present invention is a light-collecting device including an aggregate of light-transmitting films having different refractive indexes, wherein one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned.

Accordingly, a distributed refractive index light-collecting device, which can change effective refractive indexes, can be realized by changing the line width and arrangement density of the one light-transmitting film. Furthermore, following the conventional semiconductor process, a fine distributed refractive index lens can be manufactured.

Furthermore, the one light-transmitting film is buried in the other light-transmitting film. Accordingly, it can be prevented that dusts are deposited on the top surface of the light-collecting device.

Also, an optical center of the aggregate is located at a position displaced from a center of said light-collecting device. Furthermore, in the case where Φ(x) is a phase modulation depending on a distance x in an in-plane direction in the aggregate, the following equation, $$\Phi(x) = Ax^2 + Bx \sin\theta + 2m\pi$$

is approximately satisfied, where θ is an incident angle of the incident light, A and B are predetermined constants, and m is a natural number.

Accordingly, the propagation direction of light incident at a specific angle can be easily controlled so that the incident light can be condensed at an arbitral position.

Furthermore, in the light-collecting device, a difference between a refractive index of the one light-transmitting film and a refractive index of the other light-transmitting film may be 0.1 or greater. Accordingly, a distributed refractive index type light-collecting device, which can change effective refractive indexes, can be realized.

Furthermore, the refractive index of the one light-transmitting film is a value in a range from 1.45 to 3.4. Thus, using the high refractive index material, the film thickness of the light-transmitting film can be thinned so that the manufacturing process can be facilitated.

Furthermore, the refractive index of the one light-transmitting film may be greater than the refractive index of said other light-transmitting film, or the refractive index of the one light-transmitting film may be smaller than the refractive index of the other light-transmitting film.

Furthermore, a light-transmitting material for the one light-transmitting film or the other light-transmitting films is air. Consequently, the dynamic range of the refractive index distribution is increased and the light-condensing efficiency of the lens can be improved.

Furthermore, the one light-transmitting film or the other light-transmitting film further has, in a vertical direction, a multi-layered structure made of light-transmitting materials having different refractive indexes. Accordingly, gradation of the refractive indexes is increased and the high-efficient distributed refractive index lens can be manufactured.

Furthermore, a light-transmitting material for the one light-transmitting film or the other light-transmitting film varies in type or arrangement depending on a wavelength of the incident light or a wavelength of a representative light of the incident light. Consequently, a structure of a lens of each pixel can be optimized in accordance with a wavelength of the incident light so that a difference of light-condensing efficiency depending on a color can be avoided.

Furthermore, in the light-collecting device, a light-transmitting material for the one light-transmitting film or the other light-transmitting film varies in type or arrangement depending on a focal length set for the incident light. Consequently, the focal length of the incident light can be changed so that a lens which is appropriate to each pixel structure can be designed.

In the case where Δn(x) is a difference between a refractive index of the aggregate and a refractive index of a light-incoming side medium, which depends on a distance x in an in-plane direction in the aggregate, the aggregate approximately satisfies the following equation, $$\Delta n(x) = \Delta n_{max}[(Ax^2 + Bx \sin\theta)/2\pi + C]$$

where θ is an incident angle of the incident light, $\Delta n_{max}$ is a maximum value of the difference between the refractive index of said aggregate and the refractive index of the light-incoming side medium, and A, B and C are predetermined constants. Accordingly, a distributed refractive index lens with high light-condensing efficiency which can condense light incident at a specific angel at an arbitral position can be manufactured.

Furthermore, in the light-collecting device, in the case where a thickness of the aggregate is L, and a wavelength of the incident light is λ, the following equation $$\Delta n_{max} L = \lambda$$

may be approximately satisfied. Accordingly, the maximum phase modulation by the distributed index lens corresponds to one phase of the incident light and the light-collecting loss becomes the minimum. Therefore, high efficient light collecting can be achieved.

Furthermore, in the light-collecting device, a shape of a cross section of the one light-transmitting film or the other light-transmitting film in a normal direction is rectangular. Consequently, a high precision refractive index change in compliance with a design can be realized and a high sensitive solid-state imaging apparatus can be structured.

Furthermore, in the light-collecting device, the one light-transmitting film or the other light-transmitting film is made of a light-transmitting material with a diameter which is equal to or smaller than the wavelength of the incident light. Using this method, a distributed refractive index element can be easily manufactured by changing effective refractive indexes by changing particle size of adjacent light-transmitting materials.

Furthermore, in the light-collecting device, the one light-transmitting film includes one of $TiO_2$, $ZrO_2$, $Nb_2O_5$, $Ta_2O_5$, $Si_3N_4$ and $Si_2N_3$. Since they are high refractive index materials, a thickness of the light-transmitting film can be thinned, and a manufacturing process can be facilitated.

Furthermore, in the light-collecting device, the one light-transmitting film includes one of $SiO_2$ doped with B or P, that is Boro-Phospho Silicated Glass, and Teraethoxy Silane. They are materials generally used in a conventional semiconductor process. Therefore, a light-collecting device can be easily manufactured, and manufacturing costs can be reduced.

Furthermore, in the light-collecting device, the one light-transmitting film includes one of benzocyclobutene, polymethymethacrylate, polyamide and polyimide. Since such resins allow direct processing, a light-collecting device can be manufactured by nanoimprinting and mass production can be encouraged.

Furthermore, a solid-state imaging apparatus according to the present invention is a solid-state imaging apparatus which includes unit pixels arranged in a two-dimensional array, in which each unit pixel has a light-collecting device which has an aggregate of light-transmitting films having different refractive indexes. Here, one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned.

Accordingly, a solid-state imaging apparatus which includes a distributed refractive index type light-collecting device, which can change the effective refractive indexes, can be realized by changing a line width and arrangement density of the one light-transmitting film. Furthermore, following the conventional semiconductor process, a fine distributed refractive index lens can be manufactured.

While in the solid-state imaging apparatus, a color filter is positioned above the aggregate, a color filter may also be positioned below the aggregate.

Furthermore, a type or an arrangement of a light-transmitting material of the light-transmitting film differs between (a) the one light-transmitting film or the other light-transmitting film of a unit pixel located in a center of the solid-state imaging apparatus and (b) the one light-transmitting film or the other light-transmitting film of a unit pixel located in a periphery of the solid-state imaging apparatus. Consequently, a structure of a lens can be optimized depending on positions of pixels on the solid-state imaging apparatus, so that sensitivity of entire element is increased. Furthermore, since the shrinking structure of the solid-state imaging apparatus can be eased, the method of manufacturing the solid-state imaging apparatus is facilitated.

Furthermore, the aggregate of the solid-state imaging apparatus is formed so as to cover an entirety of a corresponding unit pixel. Consequently, the light-condensing loss between pixels is reduced and the sensitivity of the solid-state imaging apparatus can be improved.

Furthermore, a method of manufacturing a solid-state imaging apparatus according to the present invention is a method of manufacturing a solid-state imaging apparatus including an aggregate of light-transmitting films having different refractive indexes, in which one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned. Here, the method includes a process of forming the aggregate by nanoimprinting using a mold for a minimum processing dimension of 1 nm or less. Consequently, a large amount of fine concentric structure can be manufactured easily. Furthermore, displacements of the relative positions between pixels are prevented and the steps for the adjustment operation are reduced. Therefore, a low-priced optical device can be realized.

Furthermore, a method of manufacturing a solid-state imaging apparatus according to the present invention is a method of manufacturing a solid-state imaging apparatus including an aggregate of light-transmitting films having different refractive indexes, in which one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned. Here, the method includes a process of forming the aggregate by one of electron beam rendering and light beam rendering. Consequently, a conventional semiconductor process can be used and an ultra-fine structure can be manufactured. Therefore, an optical element with high light-condensing efficiency can be obtained.

Furthermore, a method of manufacturing a solid-state imaging apparatus according to the present invention is a method of manufacturing a solid-state imaging apparatus including an aggregate of light-transmitting films having different refractive indexes, in which one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned. Here, the method includes a process of forming the aggregate by autoagglutination of particles, each of the particles having particle size which is equal to or smaller than a wavelength of the incident light. Consequently, the number of processing steps can be reduced, and the manufacturing costs can be reduced.

Furthermore, a method of manufacturing a solid-state imaging apparatus according to the present invention is a method of manufacturing a solid-state imaging apparatus including an aggregate of light-transmitting films having different refractive indexes, in which one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned. Here, the method includes: a process of forming, on an Si substrate, a semiconductor integrated circuit which includes a light-receiving element, wiring, a light-blocking layer and a signal transmitting unit; a process of stacking a first light-transmitting film on the semiconductor integrated circuit; a process of stacking a second light-transmitting film on the first light-transmitting film; a process of processing the second light-transmitting film so as to have a concentric circle structure; a process of forming a resist on the second light-transmitting film; and a process of etching the first light-transmitting film using the second light-transmitting film as a mask. Accordingly, a lens structure in compliance with a design can be easily manufactured by setting the positional precisions of the first layer and the second layer at closer to 0. Therefore, a device with high light-condensing efficiency can be realized.

A method of manufacturing a solid-state imaging apparatus according to the present invention is a method of manufacturing a solid-state imaging apparatus including an aggregate of light-transmitting films having different refractive indexes, in which one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned. Here, the method includes: a process of forming, on an Si substrate, a semiconductor integrated circuit which includes a light-receiving element, wiring, a light-blocking layer and a signal transmitting unit; a process of forming a first light-transmitting film on the semiconductor integrated circuit, the first light-transmitting film including a first light-transmitting material and a second light-transmitting material; a process of stacking a second light-transmitting film on the first light-transmitting film; a process of processing the second light-transmitting film so as to have a concentric circle structure; a process of forming resist on the second light-transmitting film; a process of etching an interface between the first light-transmitting material and the second light-transmitting material that are included in the first light-transmitting film, using the second light-transmitting film as a mask; a process of embedding the first light-transmitting material into an air hole of the first light-transmitting film; and a process of planarizing the second light-transmitting film. Accordingly, since the material interface of the first layer is approximately matches the material interface of the second layer. Therefore, a high precision refractive index distribution can be manufactured and an element with a high light-condensing efficiency can be realized.

A method of manufacturing a solid-state imaging apparatus according to the present invention is a method of manufacturing a solid-state imaging apparatus including an aggregate of light-transmitting films having different refractive indexes, in which one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned. Here, the method includes: a process of forming, on an Si substrate, a semiconductor integrated circuit which includes a light-receiving element, wiring, a light-blocking layer and a signal transmitting unit; a process of stacking a first light-transmitting film on the semiconductor integrated circuit; a process of stacking a second light-transmitting film on the first light-transmitting film; a process of processing the second light-transmitting film so as to have a concentric circle structure; a process of forming resist on the second light-transmitting film; and a process of performing isotropic etching on the first light-transmitting film using the second light-transmitting film as a mask. Consequently, gradation of the refractive index distribution can be increased and the light-condensing efficiency can be also increased.

Furthermore, a method of manufacturing a solid-state imaging apparatus according to the present invention is a method of manufacturing a solid-state imaging apparatus including an aggregate of light-transmitting films having different refractive indexes, in which one light-transmitting film in the aggregate has a concentric circle shape with a predetermined thickness and a width which is equal to or smaller than a wavelength of incident light, and an other light-transmitting film in the aggregate concentrically fills all or a part of a space of the aggregate in which the one light-transmitting film is not positioned. Here, the method includes: a process of forming, on an Si substrate, a semiconductor integrated circuit which includes a light-receiving element, wiring, a light-blocking layer and a signal transmitting unit; a process of forming a first light-transmitting film on the semiconductor integrated circuit, the first light-transmitting film including a first light-transmitting material and a second light-transmitting material; a process of stacking a second light-transmitting film on the first light-transmitting film; a process of processing the second light-transmitting film so as to have a concentric circle structure; a process of forming resist on the second light-transmitting film; a process of performing isotropic etching an interface between the first light-transmitting material and the second light-transmitting material that are included in the first light-transmitting film, using the second light-transmitting film as a mask; a process of embedding the first light-transmitting material into an air hole of the first light-transmitting film; and a process of planarizing the second light-transmitting film.

Furthermore, a method of manufacturing a solid-state imaging apparatus includes a step of etching a material interface of the light-transmitting film made of the first and second materials, using etchant, to respective first and second materials, having different etching rates. Consequently, the volume ratio can be controlled uniquely to a material and gradation of the distribution can be further increased. Therefore, light-condensing efficiency can be improved.

A solid-state imaging apparatus of the present invention has the lens structure described in the above so that improvements of its degree of resolution and sensitivity and an easier manufacturing method can be realized. Furthermore, the deposition of dusts into fine shape can be prevented.

BRIEF DESCRIPTION OF DRAWINGS

FIGS. 29A to 29E are diagrams, each of which shows a process of manufacturing the distributed refractive index lens according to the second embodiment.

DETAILED DESCRIPTION OF THE INVENTION

Hereinafter, the embodiments of the present invention are described in detail with references to drawings. Note that, while the present invention is described with reference to drawings in the following embodiments, the present invention is not intended to be restricted to the disclose of the embodiments.

First Embodiment

Figure 5:
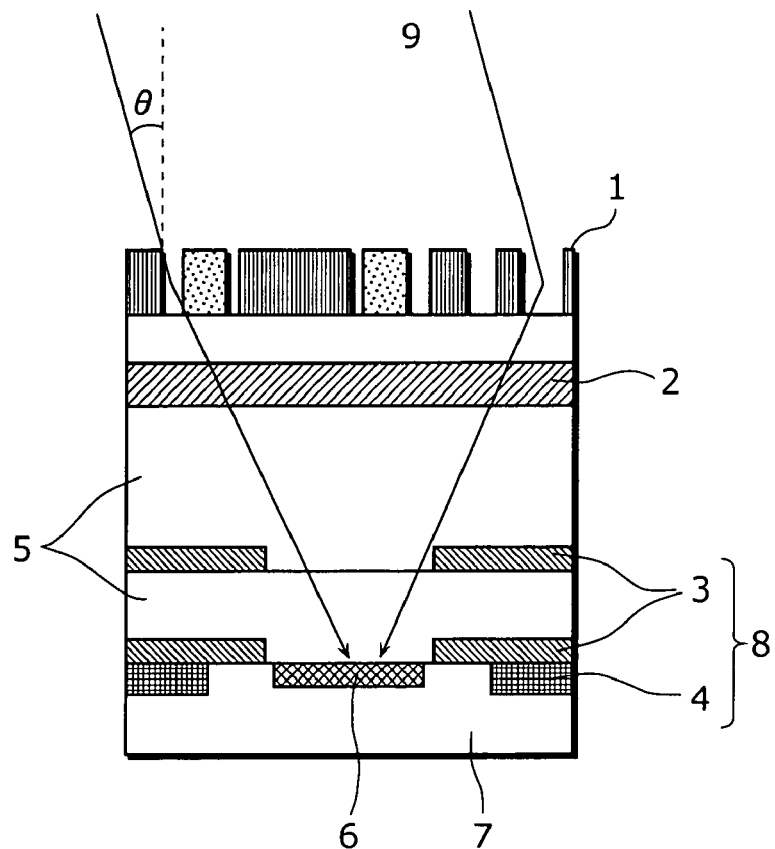
FIG. 5 is a diagram which shows a fundamental structure of a solid-state imaging apparatus according to a first embodiment.

FIG. 5 is a diagram showing a fundamental structure of a solid-state imaging apparatus according to a present embodiment. Each pixel (2.8 mm square size) includes a distributed refractive index lens 1 (also simply referred to as "a lens" or "a group of light-transmitting films"), a color filter 2 for green (G), Al wirings 3, a signal transmitting unit 4, planarized layers 5, a light-receiving element (Si photodiode) 6, and an Si substrate 7.

Figure 1:
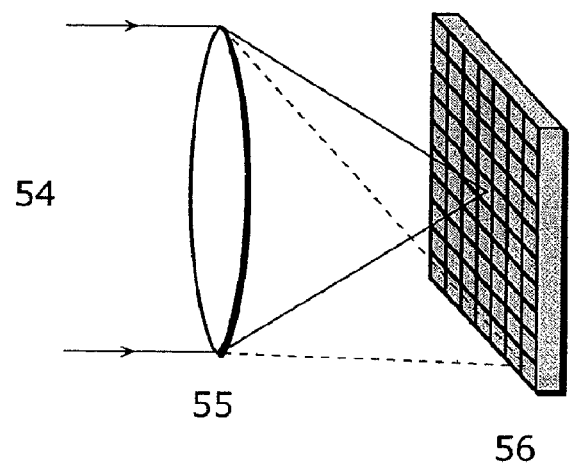
FIG. 1 is a diagram which shows a fundamental structure of pixel arrangement in the conventional solid-state imaging apparatus.
Figure 2:
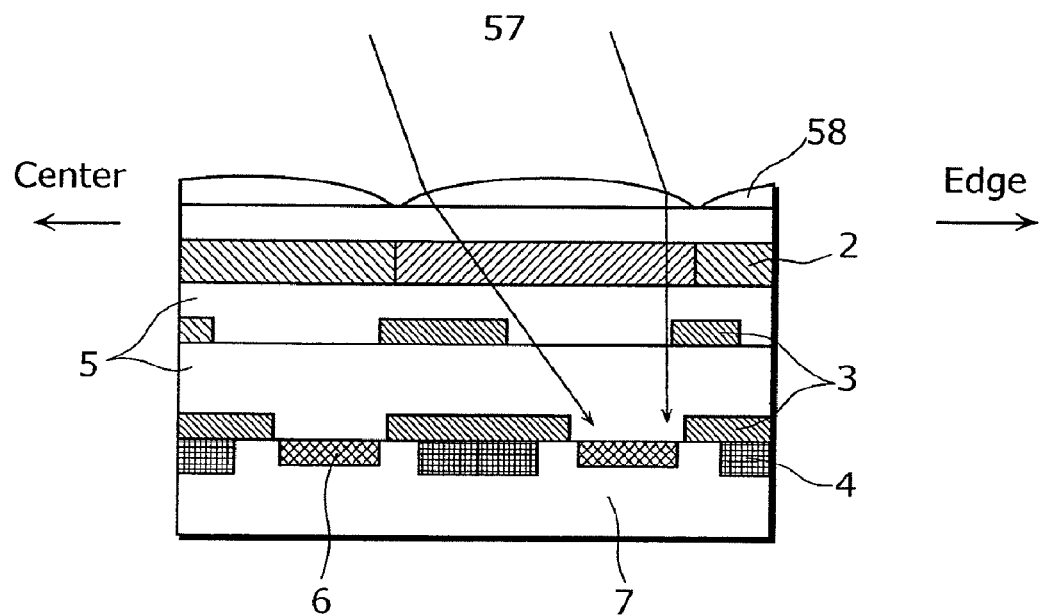
FIG. 2 is a diagram which shows a fundamental structure of the conventional solid-state imaging apparatus.
Figure 3:
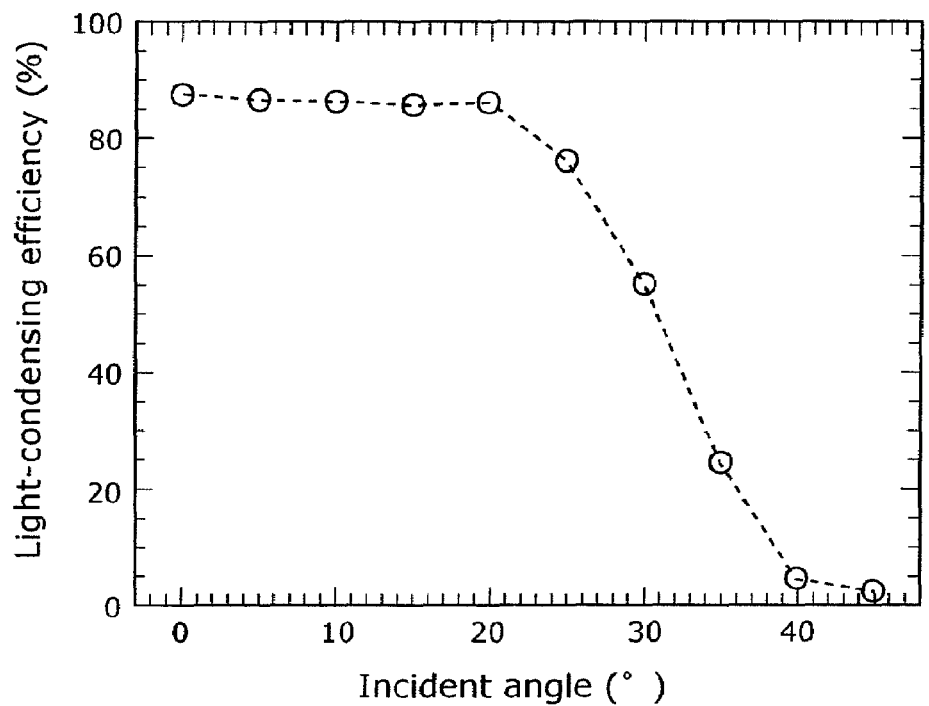
FIG. 3 is a diagram which shows light-condensing characteristics of the conventional solid-state imaging apparatus using microlens.
Figure 4:
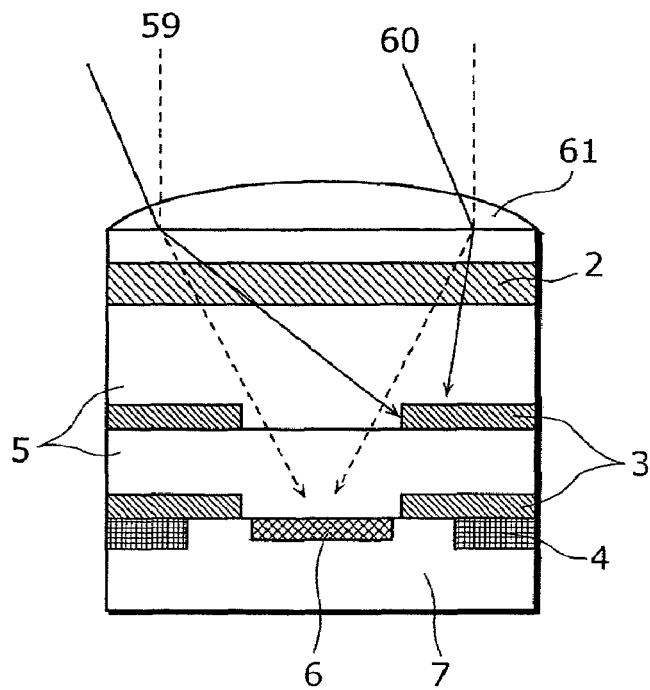
FIG. 4 is a diagram which shows a fundamental structure of a pixel in the conventional solid-state imaging apparatus.
Figure 6:
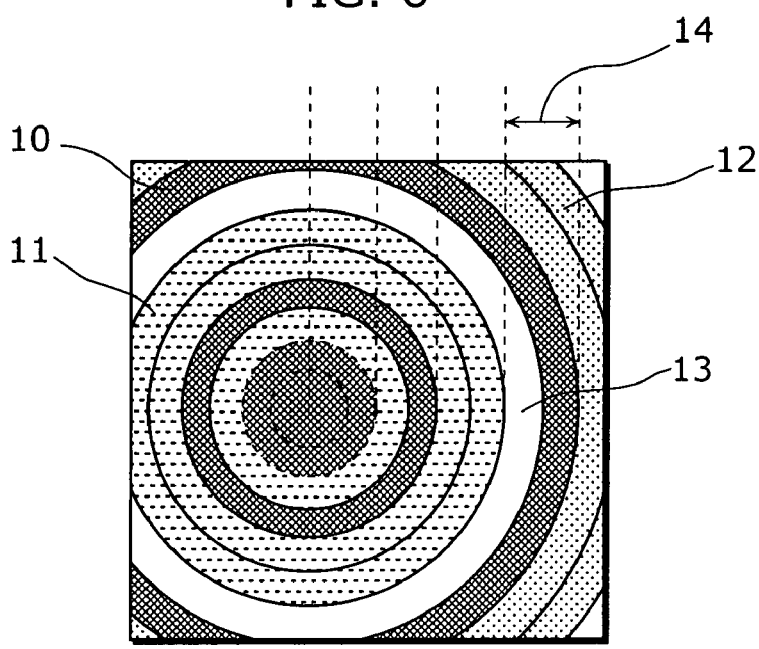
FIG. 6 is a diagram which shows an example of a top view of a distributed refractive index lens according to the first embodiment.

FIG. 6 is an example of a top view of the distributed refractive index lens 1 shown in FIG. 1. The distributed refractive index lens 1 having a concentric circle structure is made of four materials having different refractive indexes of $TiO_2$ (n=2.53), SiN (n=2.53), $SiO_2$ (n=2.53) and air (n=1.0). A difference of radiuses of outer peripheries of adjacent circular light-transmitting films is for example 200 nm (a unit width of this case is 100 nm). Also, a film thickness is 0.4 μm.

Generally, the shape of the incident window region to which light is incoming is a square shape in compliance with the aperture of each pixel. In the case where the incident window region is in a circular shape, a clearance is created between lenses so that light leakage is occurred causing a big light-condensing loss. However, when the incident window region is shaped into a square, the incident light in an entire pixel region can be condensed. Therefore, the leakage light is not occurred reducing the light-condensing loss.

Figure 7:
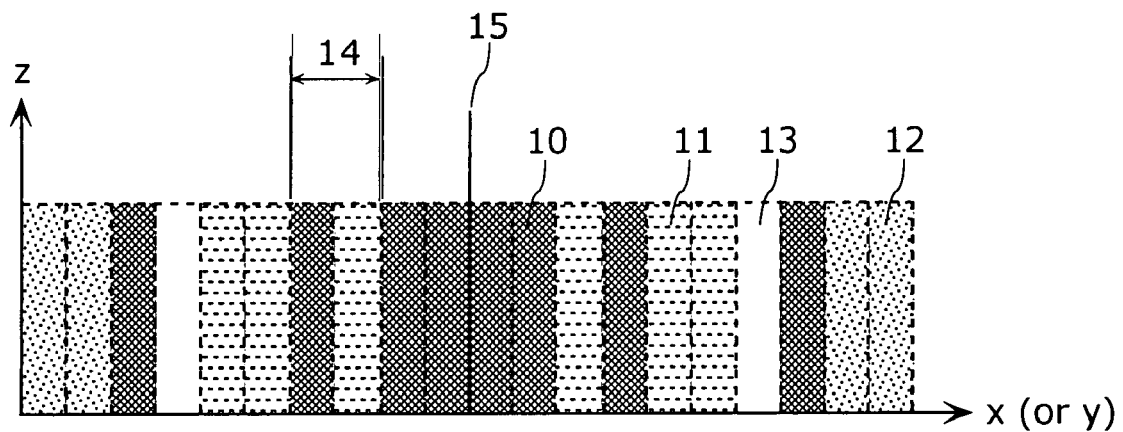
FIG. 7 is a diagram which shows a cross-section of a structure of the distributed refractive index lens according to the first embodiment.

FIG. 7 is a diagram which shows an example of a cross-section of the distributed refractive index lens 1. In a general distributed refractive index lens, the highest refractive index is obtained in the optical center 15. In the present embodiment, a ring around the optical center 15 is made of a high refractive index material $TiO_2$, and a low refractive index material such as SiN, $SiO_2$, and air is used for outer rings. In the case where a cycle is as long as or shorter than the wavelength of incident light, an effective refractive index sensed by light can be calculated by a volume ratio between the high refractive index material and the low refractive index material. The best characteristic of the present structure is that the refractive index distribution can be freely controlled only by changing the combination of adjacent materials. In the present embodiment, in addition to the refractive index change caused by using materials having different refractive indexes, a refractive index change caused by changing the width of structure in adjacent regions is used. Accordingly, the refractive index distribution with finer-grained gradation can be realized so that light-condensing efficiency is increased. However, high light-condensing efficiency (about 70 percent of light-condensing efficiency with three materials) can be obtained even with a change in refractive index by using materials having different refractive indexes. Consequently, the process is facilitated because the concentric circle structure can be formed so that both removed and remaining portions have the same width.

Figure 8:
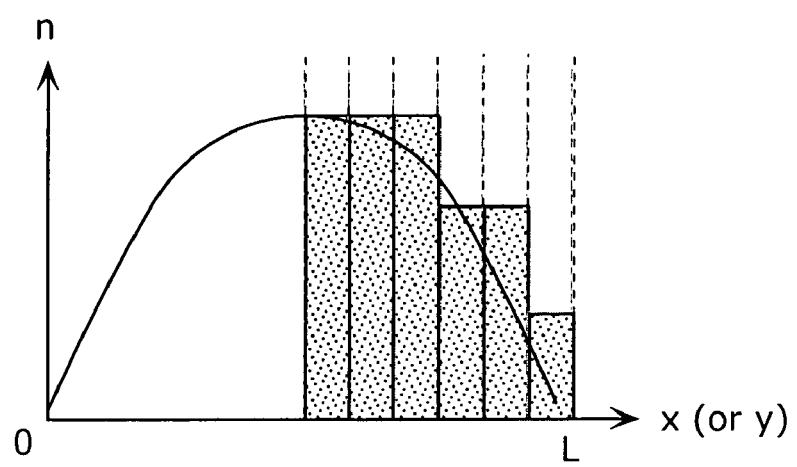
FIG. 8 is a diagram which shows a refractive index distribution of a lens according to the first embodiment.

The change of the refractive index herein is shown in FIG. 8. The refractive index of the lens is the highest in the center part of the concentric circles and gradually decreases towards the edge. The parabola shows a refractive index distribution for condensing incident light of a wavelength (550 nm) in a focal length f (4.43 μm), and it is indicated by the following equation:

$$\Delta n(x) = \Delta n_{max}\lfloor(Ax^2+Bx\sin\theta)/2\pi+C\rfloor \quad (1)$$

(A, B, and C are Constants)

Here, $\Delta n_{max}$ is a refractive index difference (1.43 in this case) between a light-incoming side medium and a lens material. Furthermore, the aforementioned equation (1) can set parameters as indicated below, where the refractive index of the light-incoming side medium is $n_0$ and a refractive index of the light-outgoing side medium is $n_1$, $$A=-(k_0 n_1)/2f \quad (1\text{-}1)$$

$$B=-k_0 n_0 \quad (1\text{-}2)$$

$$k_0=2\pi/\lambda \quad (1\text{-}3)$$

Accordingly, the lens can be optimized for each targeted focal length, an incident angle of the current incident light and wavelength. In the aforementioned equation (1), the light-condensing component is expressed by a quadric of a distance x from the pixel center, and a deviation component is expressed by a product of the distance x and a trigonometric function. It should be noted that since the actual lens has a three-dimensional structure, the refractive index distribution is expressed as a spatial function on an x axis, a y axis and a z axis. However, it is herein simply indicated as equivalent two-dimensional coordinates.

Note that, FIG. 6 is a diagram which shows a lens structure when the incident angle of light is 0°. Here, the optical center matches the center of each pixel.

It is preferred that, in the case where a wavelength of incident light is λ, a focal length in which light is gathered is f, an incident angle of the light is θ, a refractive index of an incoming side medium is $n_0$, and a refractive index of an outgoing side medium is $n_1$, a phase modulation φ(x) of the light-transmitting film depending on a distance x in an in-plane direction of the light-transmitting film satisfies the following formula, $$\Phi(x) = -\frac{k_0 n_1}{2f}x^2 - k_0 n_0 x \sin\theta \quad [\text{Formula 1}]$$

$$k_0 = \frac{2\pi}{\lambda}$$

Accordingly, the light can be condensed only in a first zone so that high efficient light condensing with small light-condensing loss can be allowed.

Furthermore, it is preferred that the phase modulation φ(x) of the light-transmitting film approximately satisfies the following equation, $$\Phi(x) = -\frac{k_0 n_1}{2f}x^2 - k_0 n_0 x \sin\theta + 2m\pi \quad [\text{Formula 2}]$$

$$k_0 = \frac{2\pi}{\lambda}$$

m = natural number

Accordingly, the light can be condensed in plural zones and the phase modulation can be increased so that a light-collecting device which is resistant to incident light with a high incident angle can be realized.

In the case where the maximum value of the refractive index of the light-transmitting film is $n_0+\Delta n_{max}$, and a difference from $n_0$ in the refractive index distribution in an in-plane direction of the light-transmitting film is Δn(x), it is preferred to approximately satisfy the following formula, $$\Delta n(x) = \Delta n_{max}\left[\frac{\phi(x)}{2\pi} + C\right] \quad [\text{Formula 3}]$$

Accordingly, a distributed refractive index lens for high light-condensing efficiency which can condense light incoming with a specific angel at an arbitral position can be manufactured.

Figure 9:
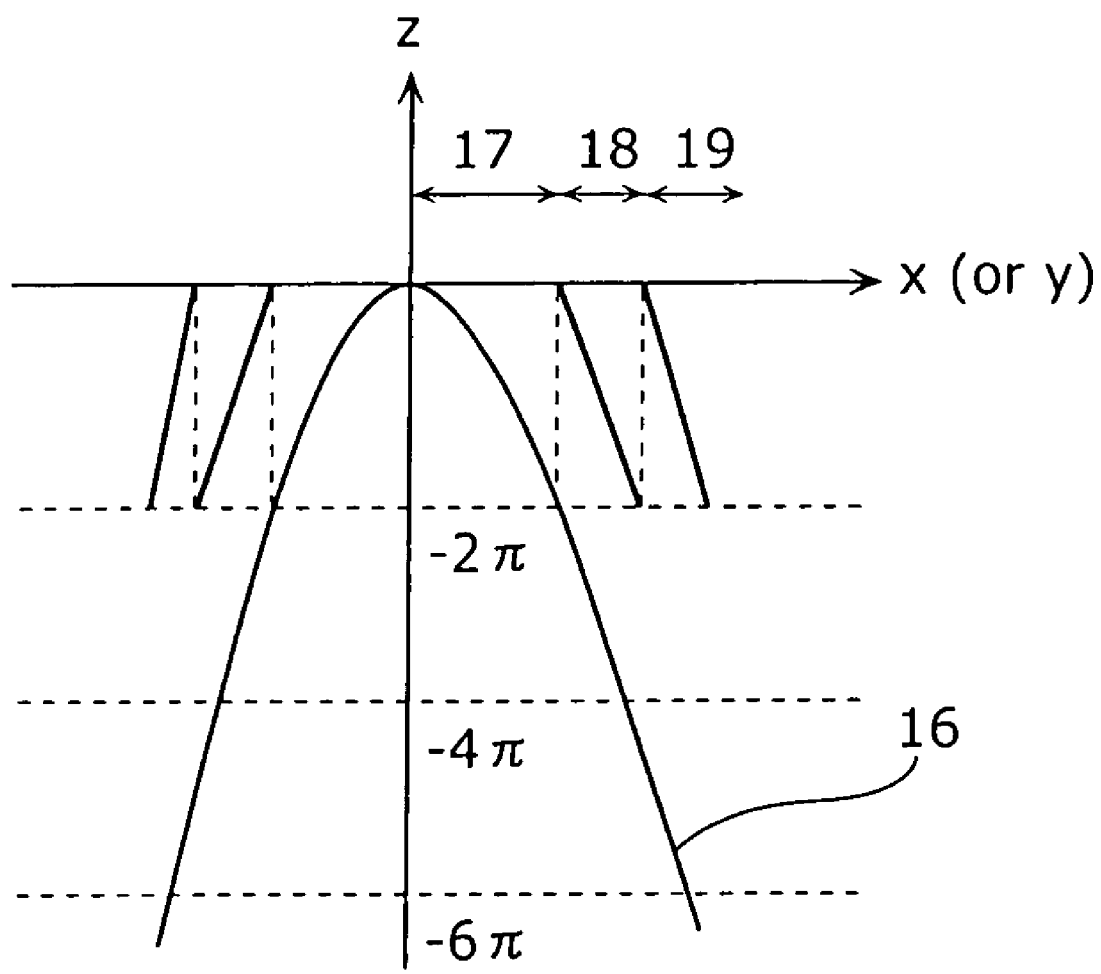
FIG. 9 is a diagram which shows a phase modulation of light according to the first embodiment.

In the present embodiment, the light propagation direction can be controlled by modulating phase of the incident light based on the refractive index distribution. Here, as shown in FIG. 9, the phase modulation obtained from the equation (1) is not only the first zone 17 but also a discontinuous phase modulations obtained by dividing the equation (1) by 2 π such as the second zone 18 and the third zone 19. However, since a zone is distinguished for each phase, effective phase modulation is equal to a continuous phase modulation 16.

Furthermore, a condition for setting the phase difference at each zone boundary to 2 π when a light-transmitting film having plural zones is formed is indicated by the following equation, $$\Delta n_{max}L = \lambda \quad (2)$$

where the lens thickness is L.

In the case of thin light-transmitting film, there is no loss factor in general. Therefore, if the aforementioned equation (2) is satisfied, the light-condensing efficiency becomes 100 percent.

Figure 10A:
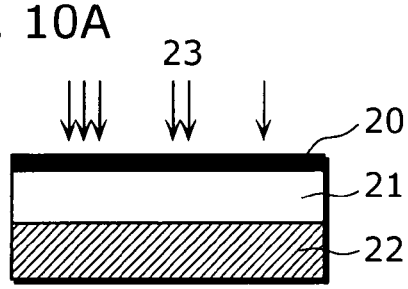
FIGS. 10A to 10H are diagrams, each of which shows a process of manufacturing the distributed refractive index lens according to the first embodiment.
Figure 10B:
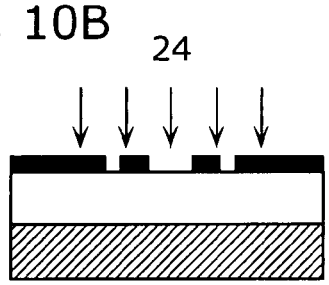
Figure 10C:
Figure 10D:
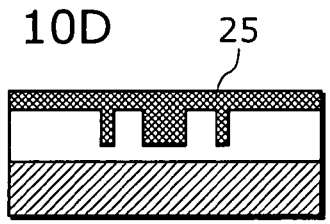
Figure 10E:
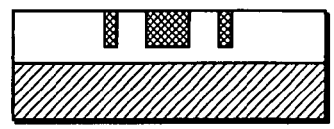
Figure 10F:
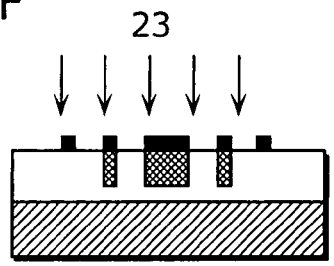
Figure 10G:
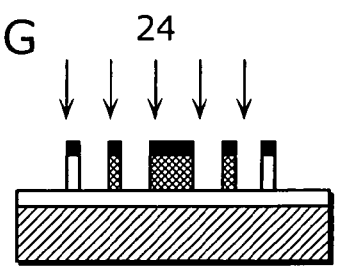
Figure 10H:
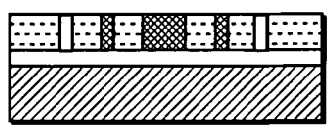

FIGS. 10A to 10H are diagrams which show a process of manufacturing a distributed refractive index lens. The lens formation is performed by photolithography and etching. First, using a normal semiconductor process, a semiconductor integrated circuit 22 (not shown in FIG. 10) including a light-receiving element, wirings, a light-blocking layer, a signal transmitting unit, and a color filter is formed on an Si substrate. Each pixel is 2.8 μm in square size and a light-receiving unit is 1.5 μm in square size. Next, using the sputtering device, the $SiO_2$ film 21 is formed and resist 20 is applied on the $SiO_2$ film 21 (FIG. 10A). After that, the resist 20 is patterned by being exposed to light 23 (FIG. 10B). The thicknesses of the $SiO_2$ film and the resist are respectively 0.5 μm. After the development of the patterned resist, it is etched so as to form a fine structure on the pixel surface (FIG. 10C). After removal of the resist, $TiO_2$ is deposited using Plasma CVD (FIG. 10D). After removal of the $TiO_2$ layer covering the entire pixel by surface grinding (FIG. 10E), resist is applied again and patterned by being exposed to light 23 (FIG. 10F). The patterned resist is then etched and SiN is deposited using CVD (FIG. 10G). Finally, the pixel surface is grinded so as to form a distributed refractive index lens made of $TiO_2$, SiN and $SiO_2$.

In the present embodiment, main three types of materials are used to form a lens. Here, it is possible to form a lens with further variety of materials using photolithography shown in FIG. 10 or a process in a combination of electronic lithography and etching.

Figure 11:
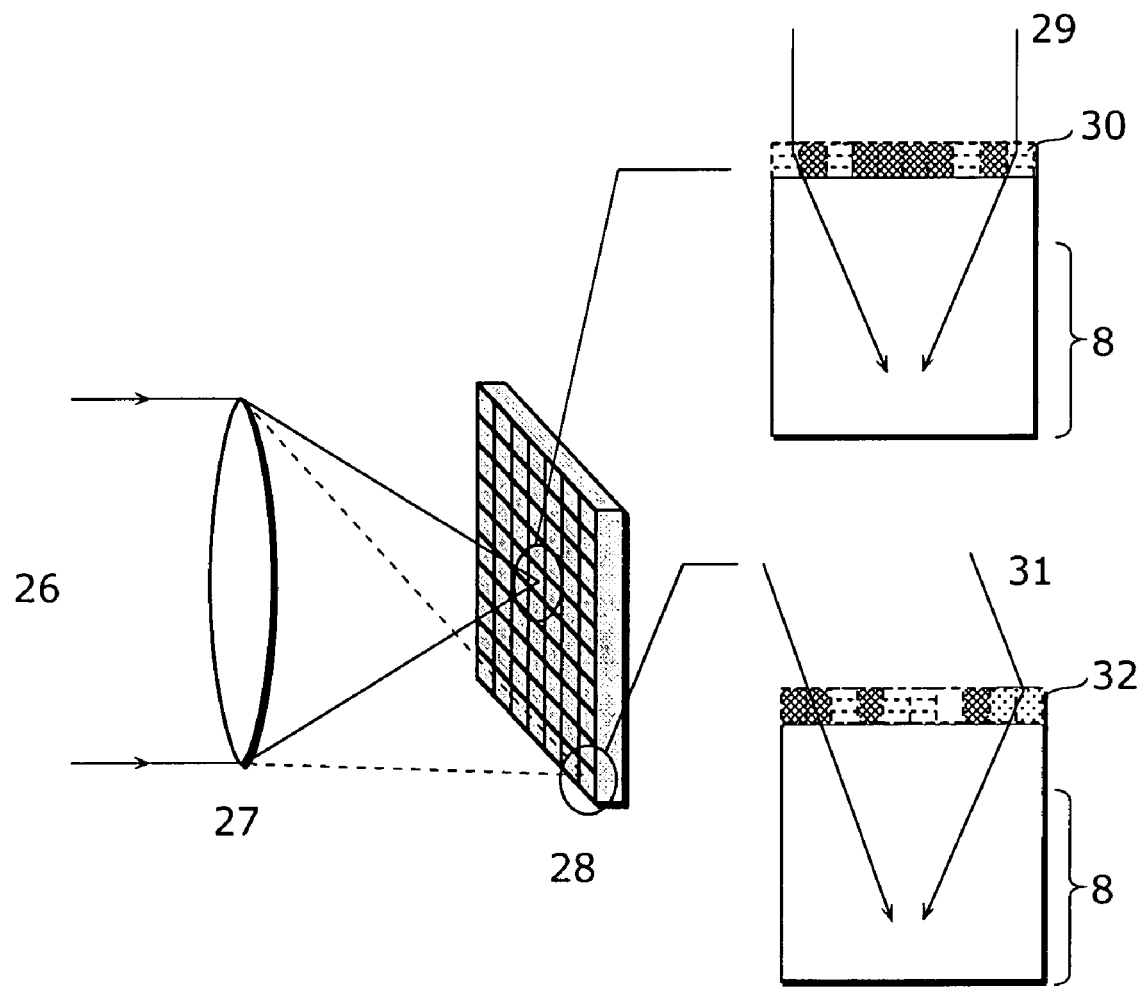
FIG. 11 is a diagram which shows a fundamental structure of pixel arrangement according to the first embodiment.

FIG. 11 is a diagram showing a state of pixel arrangement in a solid-state imaging apparatus using VGA (310,000 pixels) according to the present embodiment. The signal light 26 is condensed by the optical lens 27 and irradiated on the solid-state imaging apparatus 28 having distributed refractive index lenses. In a solid-state imaging apparatus in which the semiconductor integrated circuit 8, which includes a light-receiving element and wirings, and a distributed refractive index lens are arranged in a two-dimensional array, the incident angle of light is different for pixels in a center part and for pixels in a peripheral part. While the light enters at approximately 0° into the pixels in the center part, the light enters at the incident angle of approximately 30° into the pixels in the peripheral part. Accordingly, in the present embodiment, distributed refractive index lenses, which correspond to the incident light component with the strongest light intensity that is incident on each pixel, are formed from the center toward the peripheral part of the solid-state imaging apparatus. Each distributed refractive index lens optimizes the lens structure depending on the position of a pixel in the imaging apparatus so as to obtain the highest light-condensing efficiency.

Figure 12A:
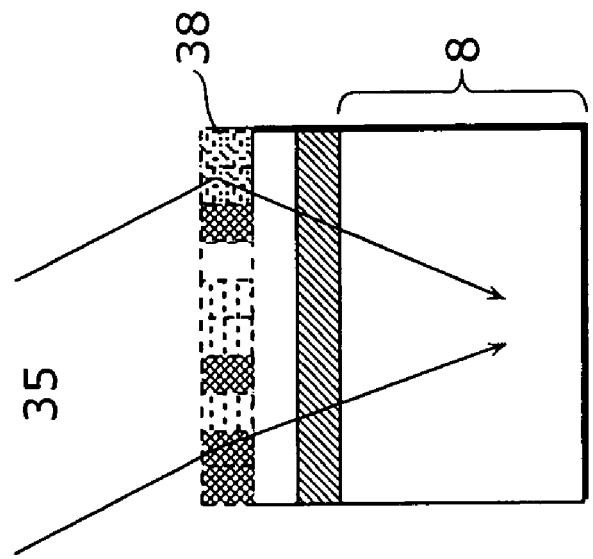
FIGS. 12A to 12C are diagrams, each of which shows a fundamental structure of a pixel depending on an incident angle of light according to the first embodiment.
Figure 12B:
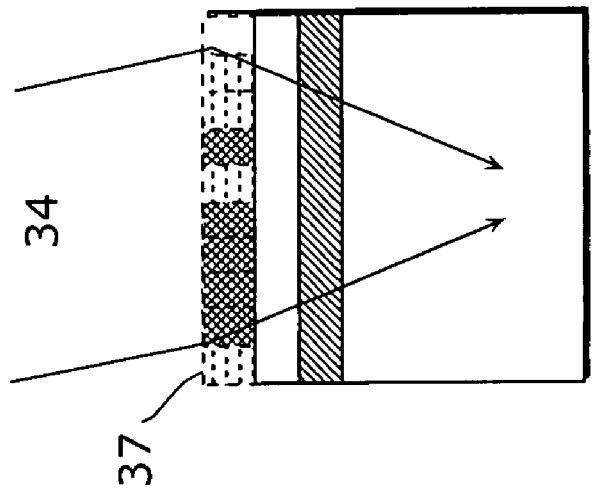
Figure 12C:
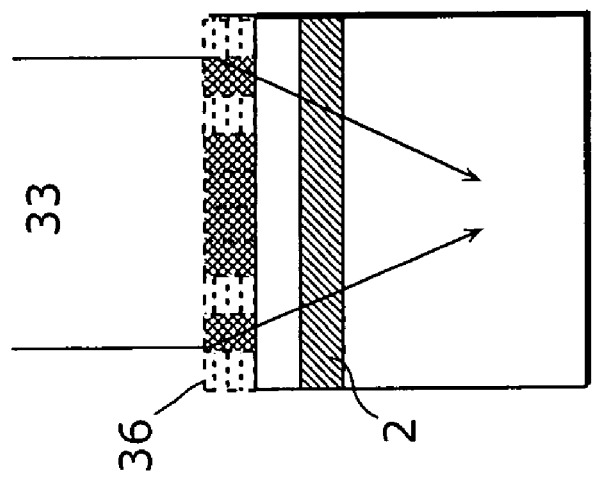

FIGS. 12A to 12C are diagrams, each of which shows a fundamental structure of a pixel depending on an incident angle (pixel position) according to the present embodiment. This lens has a refractive index distribution expressed by the equation (1) to the incident light. Light 33 incoming at an incident angle of 0°, light 34 incoming at an incident angle of $\alpha/2°$, and light 35 incoming at an incident angle of $\alpha°$, to the incident window, are respectively condensed by a distributed refractive index lens 36 for 0° incident light, a distributed refractive index lens 37 for $\alpha/2°$ incident light, and a distributed refractive index lens 38 for $\alpha°$ incident light, and are converted into an electric signal by a respective light-receiving unit via the respective color filter 2.

In the distributed refractive index lens according to the present invention, a lens structure of each pixel can be optimized in accordance with a wavelength of incident light so that light can be high-efficiently condensed without causing differences in light-condensing efficiency due to the different incident angles. In the distributed refractive index lens for 0° incident light, the center of the concentric circles located in the pixel center is shifted toward the light-incoming side along with the increase in the incident angle.

Figure 13C:
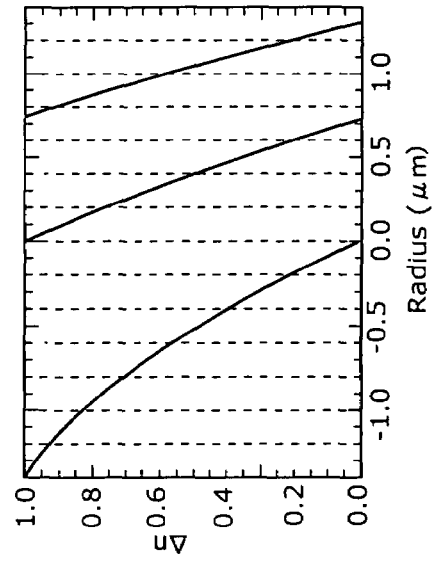
FIGS. 13A to 13C are diagrams, each of which shows a refractive index distribution of a lens according to the first embodiment.
Figure 13B:
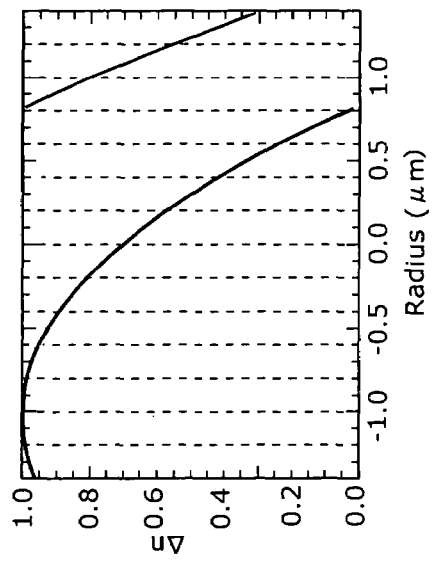
Figure 13A:
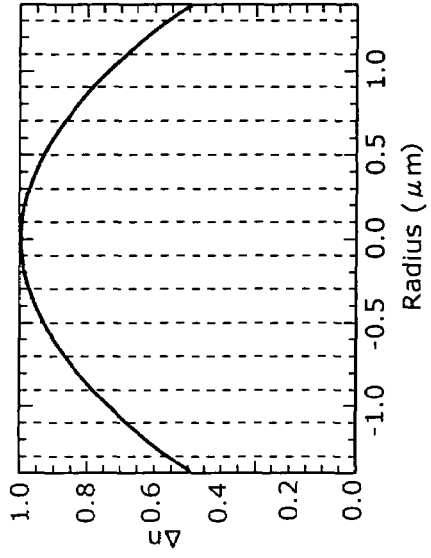

As shown in the equation (1), this is because that the maximum value of a secondary curve of the refractive index distribution shifts toward the light-incoming side as the incident angle q increases (refer to FIG. 13).

Figure 14:
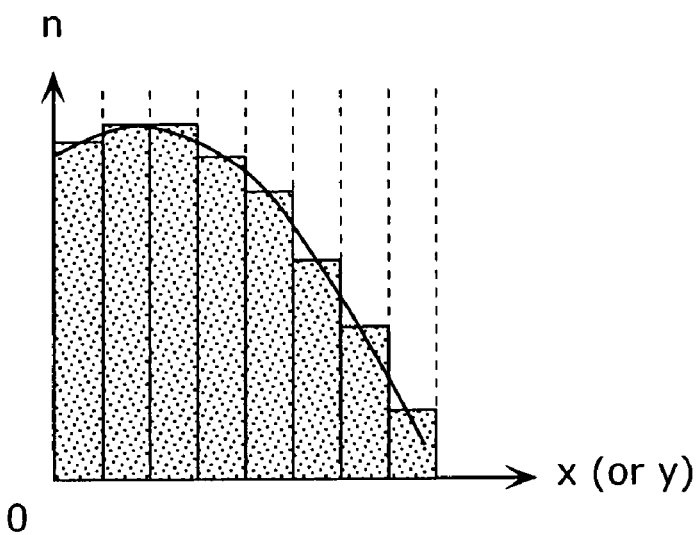
FIG. 14 is a diagram which shows a top view of the distributed refractive index lens according to the first embodiment.
Figure 15:
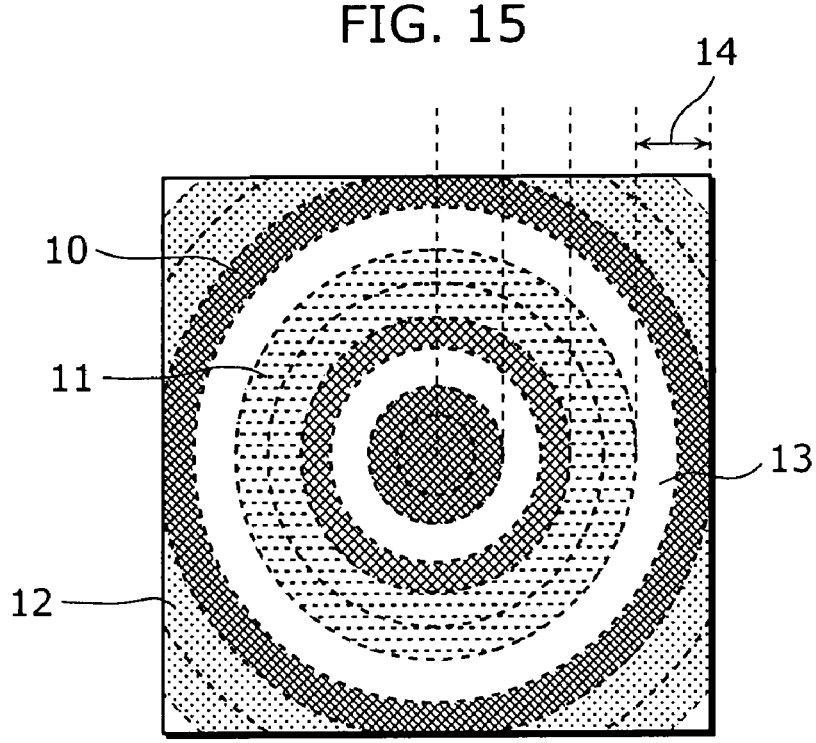
FIG. 15 is a diagram which shows a refractive index distribution of a lens according to the first embodiment.

Herein, the structure of a lens made of a material with a different refractive index is asymmetrical to the pixel region (refer to FIG. 14). Furthermore, as shown in FIG. 15, since different materials are used for respective cycles, the refractive index distribution has discrete values. However, when the cycle is sufficiently shorter than the wavelength of the incident light, the discrete components are disappeared and a continuous refractive index distribution is formed.

Furthermore, as clearly seen from the equations (1-3) and (2), the phase modulation is different depending on a wavelength of light to be phase modulated. This indicates that each pixel has an optimum lens structure in accordance with a color of light incoming to the pixel. In the present embodiment, it is known that, in the case where light of wavelength 0.45 μm, 0.55 μm, and 0.65 μm are respectively introduced into pixels having lens structures of respective colors, all lens structures can obtain light-condensing efficiency as high as 80 percent.

Figure 16:
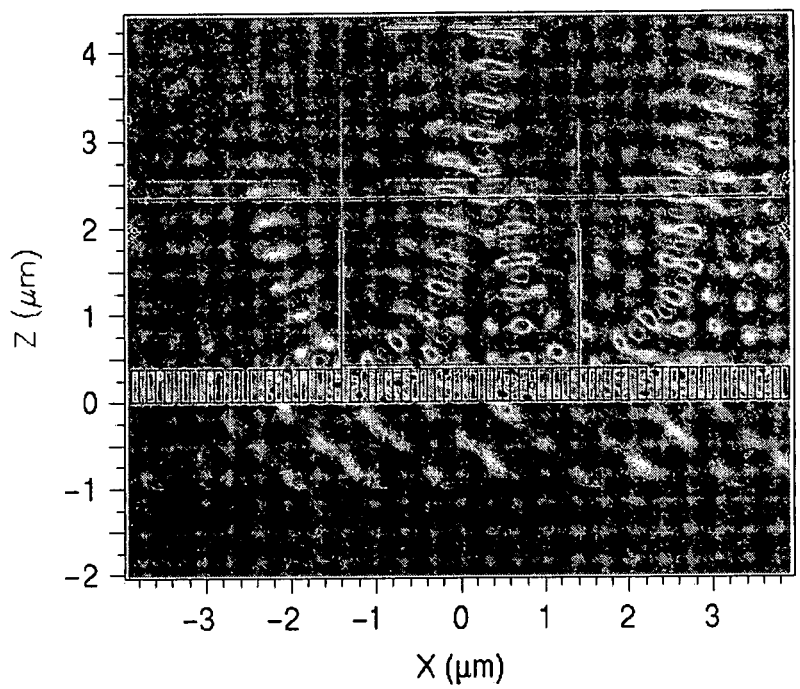
FIG. 16 is a diagram which shows a light propagation in pixels according to the first embodiment.

FIG. 16 is a diagram showing a simulation result of a light propagation profile in a pixel, for the incident light of an incident angle of 40°. In the diagram, it can be seen that the propagation direction of incident light is curved when the incident light passes through a lens; the incident light comes into a focus in the first wiring layer (a light-blocking layer), and then propagates until the light-collecting device. This implies that it is possible to propagate light efficiently to the light-collecting device using a lens manufactured in accordance with the equation (1).

Figure 17:
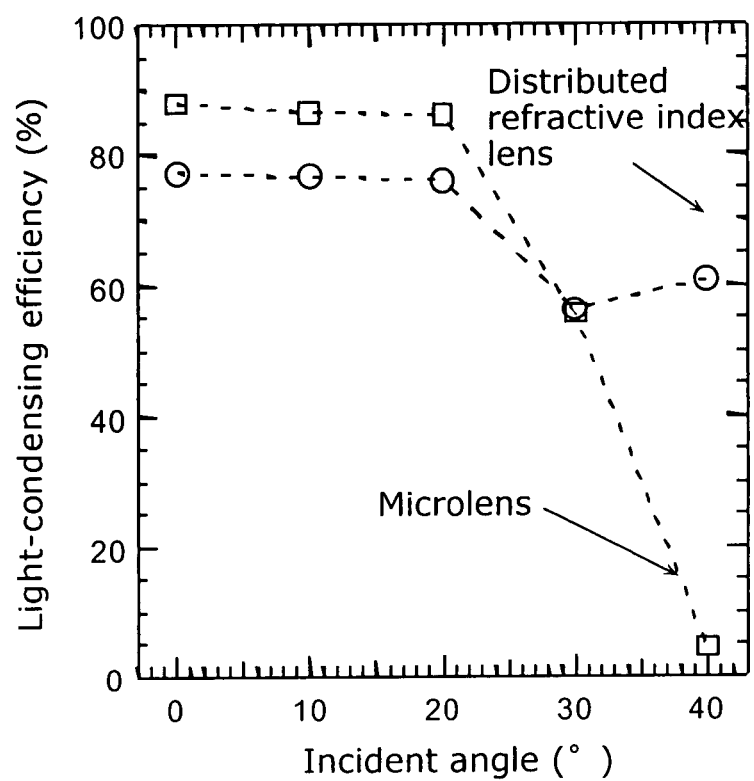
FIG. 17 is a diagram which shows a light-condensing efficiency of a solid-state imaging apparatus according to the first embodiment.

FIG. 17 is a diagram showing dependency of light-condensing efficiency on angles in a solid-state imaging apparatus according to the present embodiment. The horizontal axis indicates an angle of light incident onto the solid-state imaging apparatus. Here, an angle of 0° indicates a center part and an angle of 30° or greater indicates a peripheral pixel. While the light-condensing efficiency of the solid-state imaging apparatus using microlenses rapidly decreases from pixels of incident angle of 20°, the light-condensing efficiency is kept in 60 percent even in the peripheral pixel in the distributed refractive index lens according to the present invention. As clearly shown in FIG. 17, it is found that the distributed refractive index lens of the present invention has a strong angle dependency of incident light (in other words, the light-condensing efficiency does not rely so much on an angle of the incident light), compared to the microlens. Consequently, a decrease in light-condensing efficiency along with the increase of incident angle can be moderated so that the present invention is expected to be applicable for a short-focal point optical system such as a camera for a cell phone.

Second Embodiment

Figure 18:
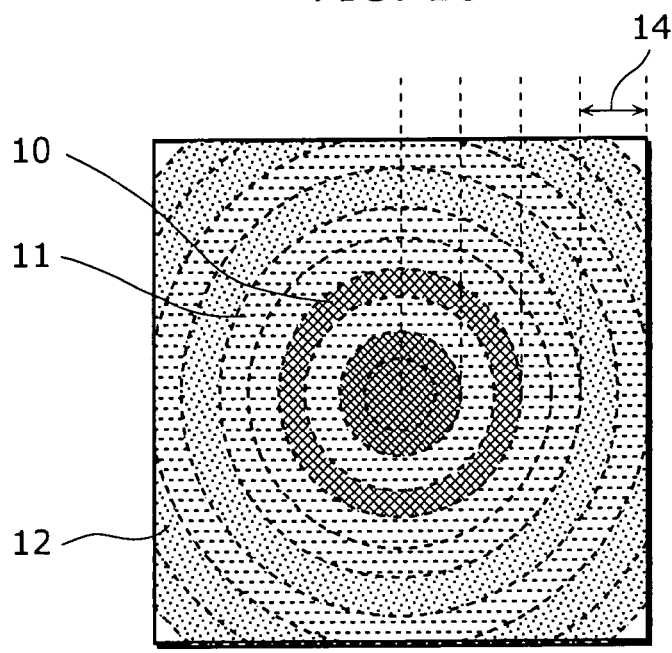
FIG. 18 is a diagram which shows a top view of a distributed refractive index lens according to the second embodiment.

FIG. 18 is a top view of a distributed refractive index lens having no air region according to the second embodiment. With no air region, whereas the dynamic range of the refractive index change is reduced, the surface of the lens can be planarized so that dispersion loss can be decreased. Furthermore, layers can be further stacked on the top surface of the lens so that the distributed refractive index lens is easily applied to the multi-layered lens.

Figure 19:
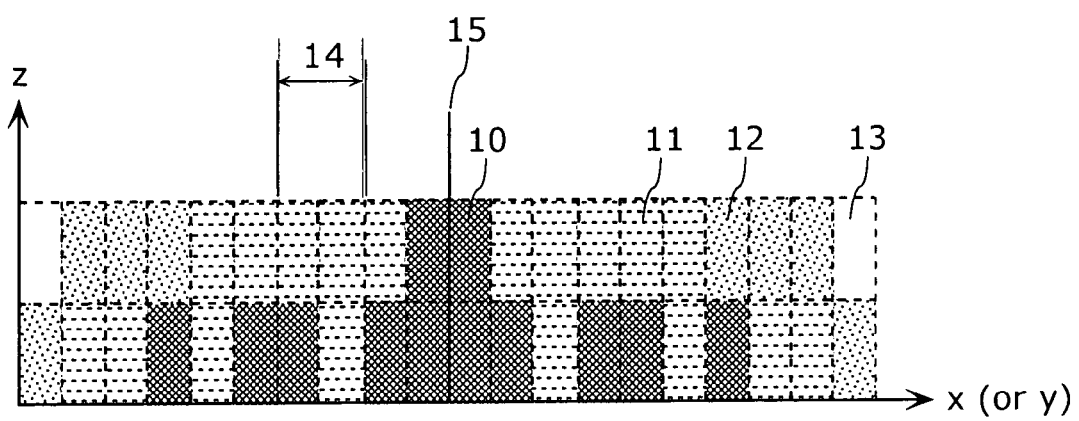
FIG. 19 is a diagram which shows a cross-section of the distributed refractive index lens according to the second embodiment.

FIG. 19 is a diagram showing a structure of the distributed refractive index lens having a multi-layered structure according to the present embodiment. By allocating plural light-transmitting materials having different refractive indexes not only in an in-plane direction but also in a vertical direction (in other words, z direction), gradation of the refractive index distribution can be significantly increased. Accordingly, the discrete refractive index change becomes continuous and the light-condensing efficiency can be increased.

Figure 20:
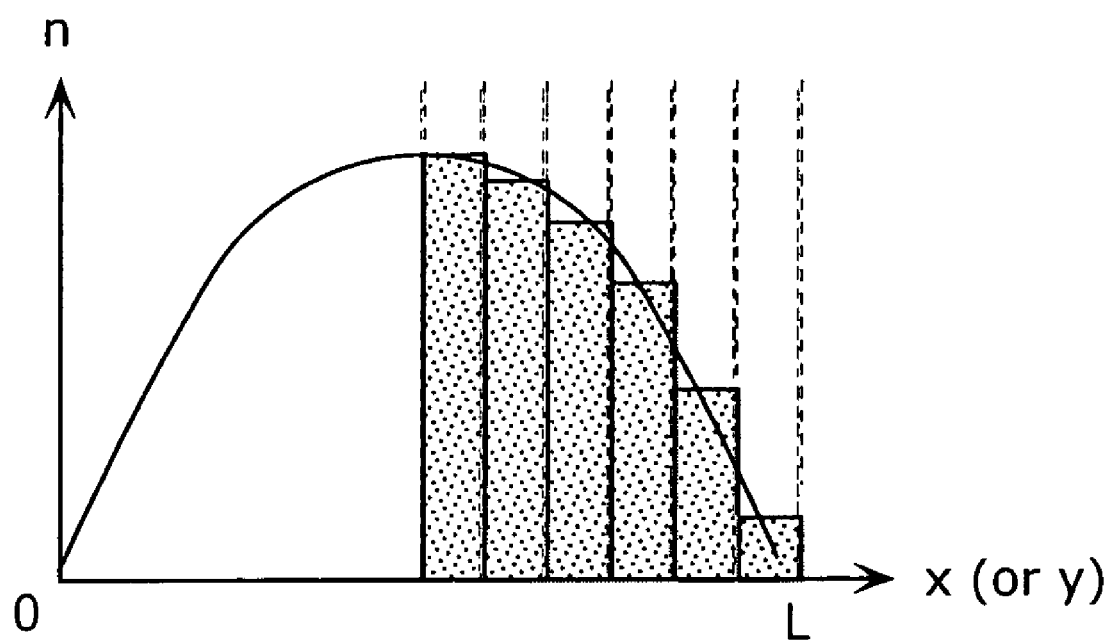
FIG. 20 is a diagram which shows a refractive index distribution of a lens according to the second embodiment.
Figure 21A:
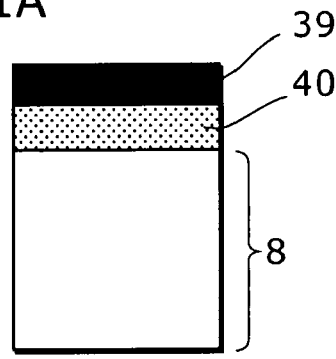
FIGS. 21A to 21F are diagrams, each of which shows a process of manufacturing the distributed refractive index lens according to the second embodiment.
Figure 21D:
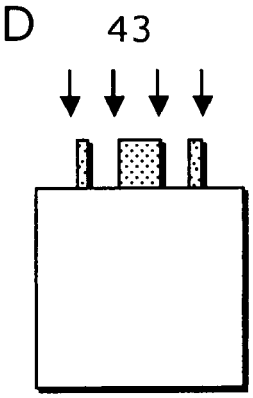
Figure 21B:
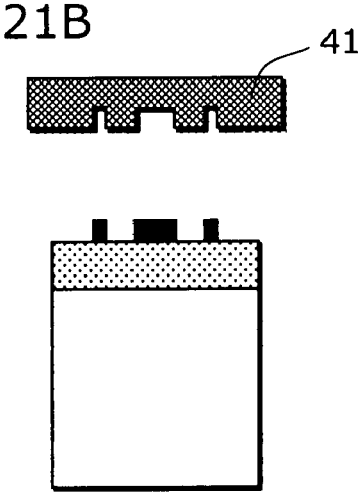
Figure 21E:
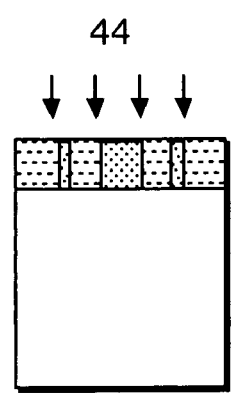
Figure 21C:
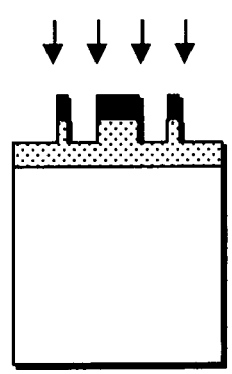
Figure 21F:
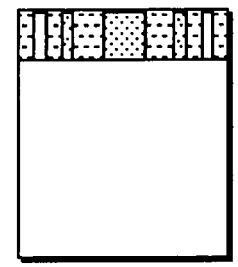

FIG. 20 is a diagram which shows a refractive index distribution of a lens according to the present embodiment.

FIG. 21 is a diagram which shows a process of manufacturing a distributed refractive index lens according to the present embodiment. The lens formation is performed by nanoimprinting and etching. First, using a normal semiconductor process, a semiconductor integrated circuit 8 (not shown in FIG. 21) including a light-receiving element, wirings, a light-blocking layer and a signal transmitting unit is formed on an Si substrate. Here, one pixel is 2.8 μm square size and the light-receiving unit is 1.5 μm square size. After that, a $TiO_2$ film 40 is formed using a plasma CVD, and resist 39 is coated on the $TiO_2$ film 40 (FIG. 21A). Here, the thicknesses of the $TiO_2$ film and the resist are respectively 0.5 μm. An SiC made mold 41, which is patterned with a concentric structure, is hot-pressed to the resist at 150° C. so as to transfer a fine structure on the resist (FIG. 21B). It should be noted that the mold is formed by general electron beam lithography and etching. After that, the resulted structure is post-baked at 180° C., and first etching 42 is performed on the post-baked structure by Ar ion milling (FIG. 21C). After removing the resist, a concentric circle structure is formed on a pixel by wet etching 43 (FIG. 21D). Finally, SiN is deposited on the concentric structure using plasma CVD 44, and the SiN is planarized through surface grinding (FIG. 21E). By repeating the processes of FIGS. 21A to 21E, a distributed refractive index lens made of $TiO_2$, SiN, and $SiO_2$ is manufactured.

Figure 22A:
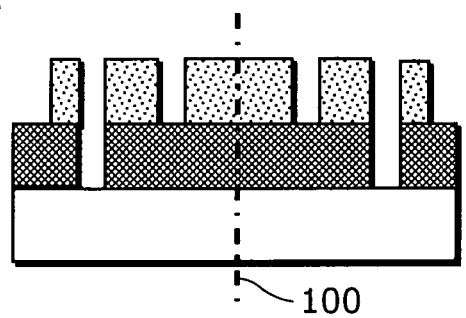
FIGS. 22A and 22B are diagrams, each of which shows a state in which positions of the pixel and the distributed refractive index lens are aligned according to the second embodiment.
Figure 22B:
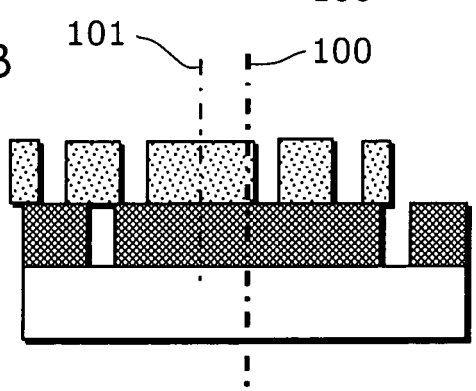

The distributed refractive index lens having a multi-layered structure according to the present embodiment can be manufactured using the manufacturing method shown in FIG. 21. Here, the most significant process is to align the positions of the first light-transmitting film on the substrate side and the second transmitting film to be formed on the first light-transmitting film. In order to form a light-transmitting film with a refractive index distribution as indicated by the equation (1), it is required to form a three-dimensional structure with high precision. Therefore, it is desirable that the positional alignment precision of the first light-transmitting film and the second light-transmitting film is closer to 0 (FIG. 22A). However, with the current positional alignment technology, it is impossible to form a multi-layered structure without any precise misalignment, thus causing misalignments (FIG. 22B).

Figure 23A:
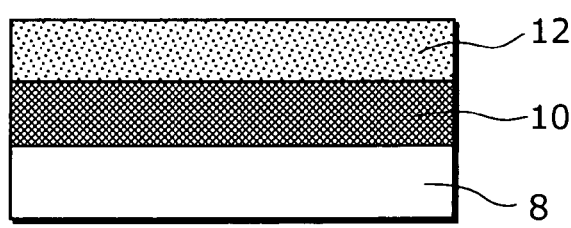
FIGS. 23A to 23C are diagrams, each of which shows a process of manufacturing the distributed refractive index lens according to the second embodiment.
Figure 23B:
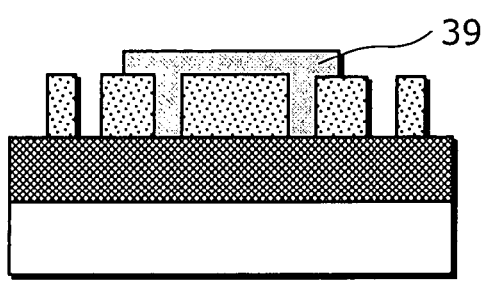
Figure 23C:
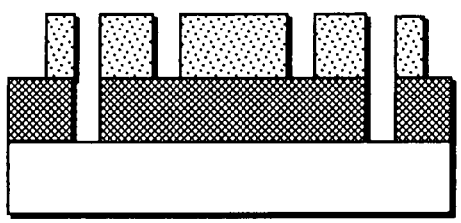

Accordingly, a multi-layered structure formation process with high positional alignment precision, which is an application of a self-alignment method, is used for manufacturing a lens according to the present embodiment. FIG. 23 shows a process of manufacturing a distributed refractive index lens. First, a semiconductor integrated circuit 8 (not shown in FIG. 23) is formed by stacking, on the Si substrate, a light-receiving element, wirings, a light-blocking layer, and a signal transmitting unit. After is that, a $TiO_2$ film 10 and a $SiO_2$ film 12 are formed using plasma CVD (FIG. 23A). After forming asperities in the second layer using EB rendering, optical rendering or nanoimprinting, resist 39 is applied in a portion in which a structure is not formed in the first layer (FIG. 23B). After forming asperities in the first layer by etching, the resist is removed and the concave structure is filled with other materials if necessary (FIG. 23C). In the manufactured distributed refractive index lens, the positional precision of the first layer and the second layer is closer to 0 and the lens structure in compliance with the layout can be easily manufactured. Therefore, an element with high light-condensing efficiency can be obtained.

Figure 24A:
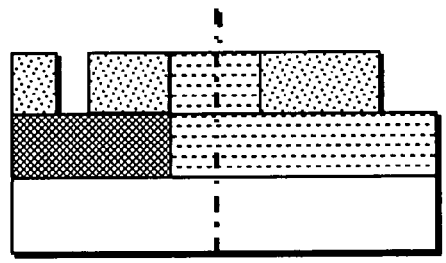
FIGS. 24A and 24B are diagrams, each of which shows a state in which positions of the pixel and the distributed refractive index lens are aligned according to the second embodiment.
Figure 24B:
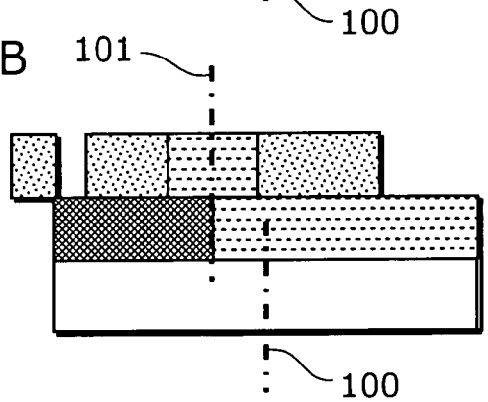

Furthermore, in the present invention, it is necessary to change a material, which constitutes each optical device, in a fine region (a region smaller than the wavelength of light). In particular, in the case where the multi-layered structure is manufactured, the second layer has to be manufactured with high precision in accordance with the change of the material of the first layer (FIG. 24A). It is impossible to manufacture a distributed refractive index lens with a high light-condensing efficiency unless two types of adjacent materials exist in a fixed volume ratio in the fine region (FIG. 24B).

Figure 25A:
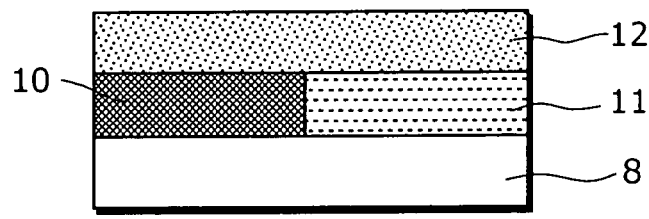
FIGS. 25A to 25C are diagrams, each of which shows a process of manufacturing the distributed refractive index lens according to the second embodiment.
Figure 25B:
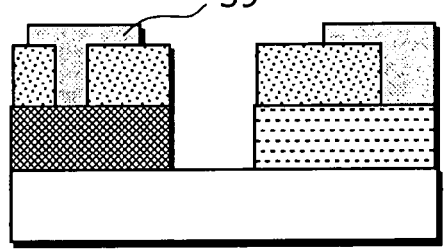
Figure 25C:
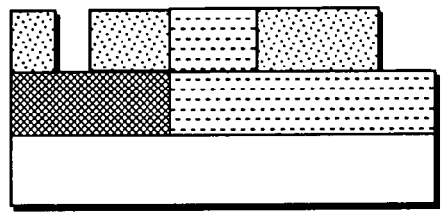

FIG. 25 shows a process of manufacturing a distributed refractive index lens according to the present embodiment. First, a semiconductor integrated circuit 8 (not shown in FIG. 25) including a light-receiving element, wirings, a light-blocking layer, and a signal transmitting unit is formed on an Si substrate. After that, a first layer, which includes $TiO_2$ film 10 and an SiN film 11, is formed using a rendering process and plasma CVD, and $SiO_2$ film 12 is then stacked on the first layer (FIG. 25A). Next, the SiN film 11 is patterned using the rendering process or nanoimprinting, and resist 39 is applied in a portion in which a structure is not formed in the first layer. After forming asperities in the first layer by etching, the resist is removed (FIG. 25B). Finally, SiN is deposited so as to fill the concave structure, and surface grinding is performed (FIG. 25C). In the manufactured distributed refractive index lens, the positional precision of the first layer and the second layer is the most-closer to 0 and the material interface of the first layer and the material interface of the second layer almost match with each other. Accordingly, a refractive index distribution with high precision can be formed so that a device with a high light-condensing efficiency can be obtained.

Figure 26A:
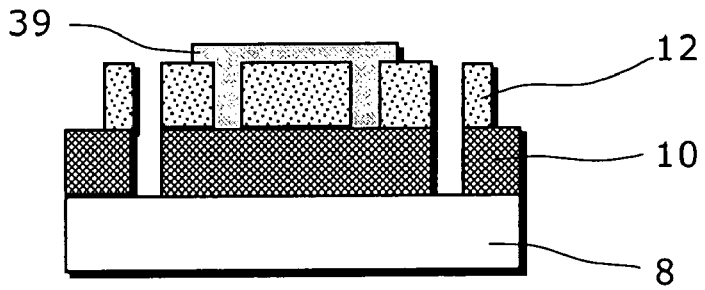
FIG. 26A is a cross-section diagram of the distributed refractive index lens in the case where multi-layer structure is formed by anisotropic etching according to the second embodiment.
Figure 26B:
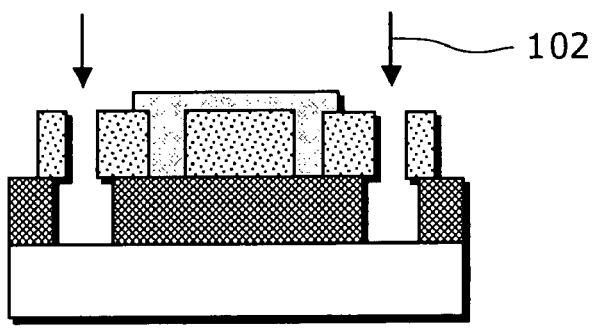
FIG. 26B is a cross-section diagram of the distributed refractive index lens in the case where line-width in a lateral direction is controlled by isotropic etching.

FIG. 26A is a cross-section diagram of a distributed refractive index lens in the case where a multi-layered structure is formed by anisotropic etching. Since the cross-section is rectangular in shape, the refractive index distribution is easily controlled. However, in order to increase gradation of the distribution, the removed/remaining width of the asperities has to be decreased. Therefore, a processing technique of forming a finer structure is required for forming a pattern by rendering or nanoimprinting. Accordingly, in the present invention, the line width in a horizontal direction is controlled by isotropic etching (FIG. 26B). Consequently, the refractive index distribution can be controlled based on etching conditions; gradation of the distribution is increased; and light-condensing efficiency is improved as a result.

Figure 27A:
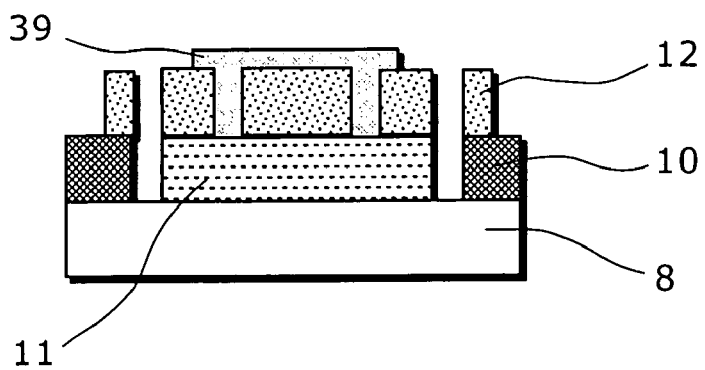
FIG. 27A is a cross-section diagram of a lens which is formed in the case where an etchant having a same degree of etching rate as the etchant used for the first layer is used for the second material.
Figure 27B:
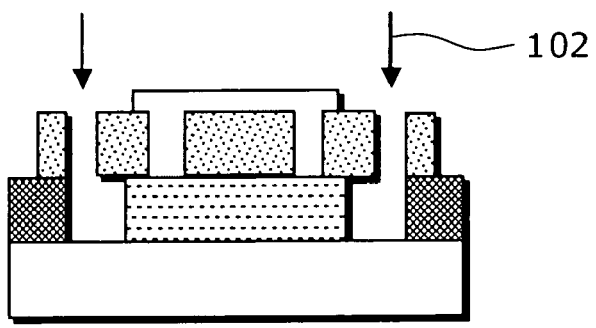
FIG. 27B is a cross-section diagram of a lens which is formed in the case where an etchant having a different etching rate from the etching rate of the etchant used for the first layer is used for the second material.

Furthermore, FIG. 27A is a diagram showing a cross-section of a lens to be manufactured in the case where etchant with an etching rate of as much as the etching rate of the second material which constitutes the first layer is used. As described in the above, when the cross section is formed in a rectangular shape, it is easy to control the refractive index distribution, while the pattern formation process becomes difficult. Here, FIG. 27B is a diagram showing a cross-section of a lens to be formed in the case where etchant with an etching rate, which is different from the etching rate of the second material which constitutes the first layer, is used. Consequently, the volume ratio can be controlled based on types of materials so that gradation of the distribution is further increased and the light-condensing efficiency is improved as a result.

The aforementioned manufacturing process and the manufactured structure are useful not only for the two-layered structure, but also for a multi-layered structure having three or more layers. Additionally, by forming a multi-layered structure with a high alignment precision using the aforementioned method, moire caused by interferences between layers can be prevented.

Figure 28:
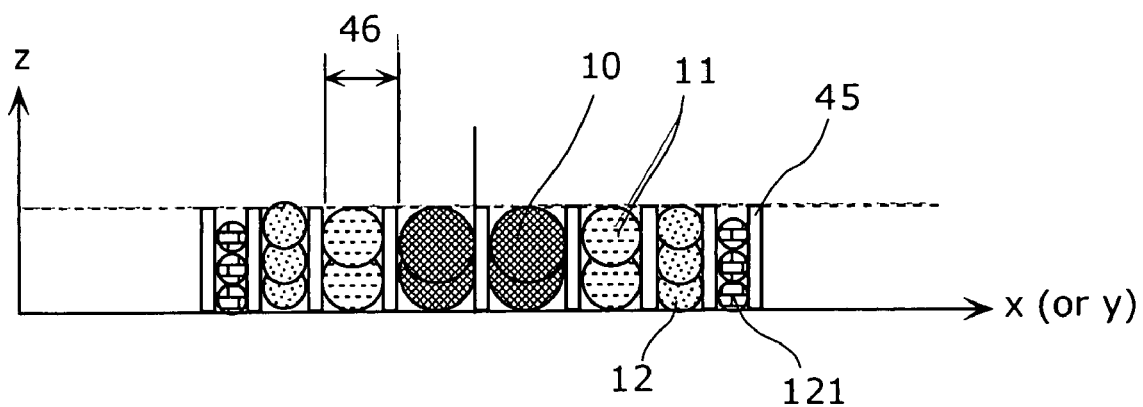
FIG. 28 is a diagram which shows a cross-section of a structure of a distributed refractive index lens made of a concentration of fine particles according to the second embodiment.

FIG. 28 is a diagram showing a cross-section of a structure of a distributed refractive index lens configured of a concentration of particles according to the present embodiment. The refractive index distribution is formed as a result of which particles having different refractive indexes and different particle size are spatially concentrated by being divided by partitions 45 made of $GeO_2$. When the diameter of a particle is smaller than an incident wavelength, the refractive index distribution sensed by light becomes continuous so that high light-condensing efficiency is obtained.

FIGS. 29A to 29E are diagrams showing a process of manufacturing the distributed refractive index lens according to the present embodiment. The lens formation is performed by photolithography and etching. First, a semiconductor integrated circuit 8 (not shown in FIG. 29) is formed by stacking, on the Si substrate, a light-receiving element, wirings, a light-blocking layer, a signal transmitting unit, and a color filter. Each pixel is 2.8 μm square size and a light-receiving unit is 1.5 μm square size. After that, using the sputtering device, the $GeO_2$ film 48 is formed and resist 47 is applied on the $GeO_2$ film 48 (FIG. 29A). Next, the resist 47 is patterned by being exposed to light 49 (FIG. 29B). The thicknesses of the $SiO_2$ film and the resist are respectively 0.5 μm. After forming a fine structure by etching, aqueous solution 51 including TiO₂ particles 50 (particle size 200 nm) is dropped (FIG. 29C). After this process, water in the aqueous solution is vaporized through heating. Herein, the particles are embedded into the air holes by sufficiently slowing down the vaporization speed of water. Next, redundant particles on the sample surface are removed by air-blowing, and aqueous solution including SiN particles 50 (particle size 150 nm) is dropped this time (FIG. 29D). The particles-concentrated distributed refractive index lens is manufactured by repeating the aforementioned processes (FIG. 29E). There are two significant points for this manufacturing method. The first point is that the width of a fine concave structure formed by rendering pattern needs to be slightly increased than the particle size of the particles to be concentrated (about 10 percent). The second point is that the concentrated region of particles can be selectively restricted by starting dropping from fine particles to larger particles. In a region in which particles are already concentrated, new particles are not included (even new particles are included, the amount of the newly included particles is very little so that there is no influence on the refractive index change), so that selecting a material is facilitated. Using these methods, the positional alignment and planarization as shown in the aforementioned manufacturing method are no longer necessary so that the process is simplified, reducing the manufacturing costs.

Third Embodiment

Figure 30:
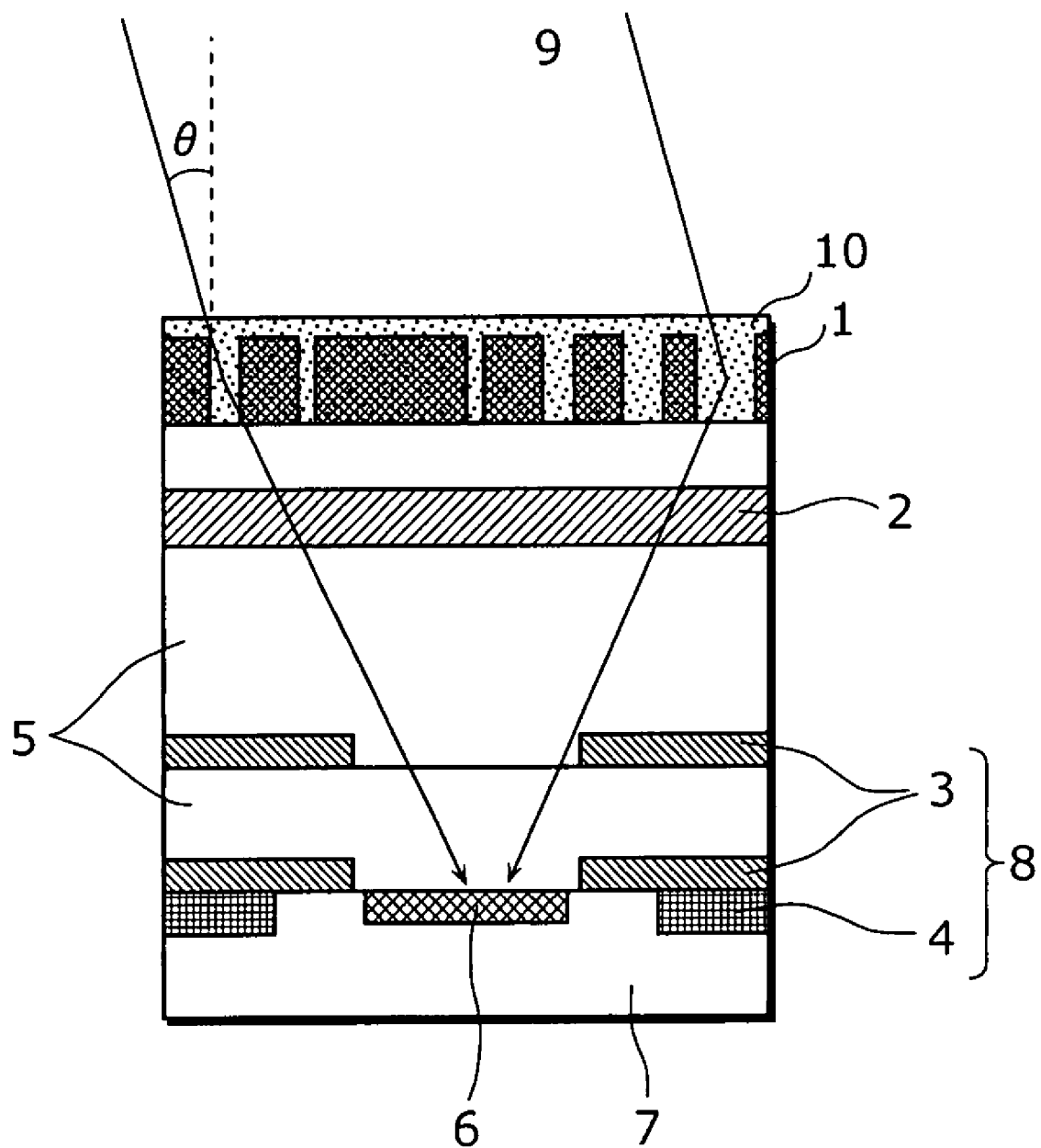
FIG. 30 is a diagram which shows a fundamental structure of a solid-state imaging apparatus according to a third embodiment.

FIG. 30 is a diagram showing a fundamental structure of a solid-state imaging apparatus according to a present embodiment. Compared to the first embodiment, the following describes the present embodiment.

Each pixel (2.8 mm square size) includes a distributed refractive index lens 71, a color filter 2 for green (G), Al wirings 3, a signal transmitting unit 4, a planarized layer 5, a light-receiving is element (Si photodiode) 6, and an Si substrate 7.

Figure 31:
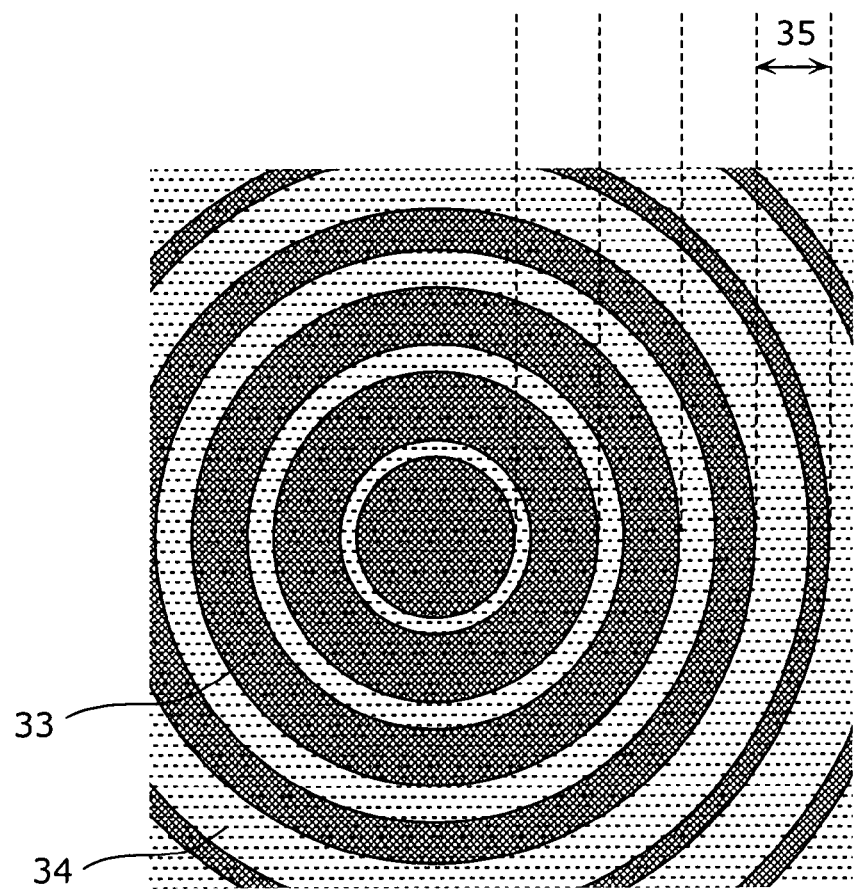
FIG. 31 is a diagram which shows a top view of a distributed refractive index lens according to the third embodiment.

FIG. 31 is a diagram which shows a top view of the distributed refractive index lens 71 in FIG. 30. In the distributed refractive index lens 71 having a concentric circle structure is made up of a high refractive index material 33 [TiO₂ (n=2.53)] which is a first light-transmitting film and a low refractive index material 34 [SiO₂ (n=1.45)] which is a second light-transmitting film. Here, the line width of the concentric circles of the adjacent second light-transmitting films is the largest in the center of the circle and becomes smaller toward an outer ring. When each cycle is equal to or smaller than a wavelength of the incident light, the effective refractive index sensed by light can be calculated by a volume ratio between the first light-transmitting film which is the high refractive index material and the second light-transmitting film which is the low refractive index material. The best feature of this structure is that the refractive index distribution can be freely controlled only by changing a circular width, that is, a volume ratio of light-transmitting films (refer to Japanese Laid-Open Patent Application No. 2003-421111).

Figure 33:
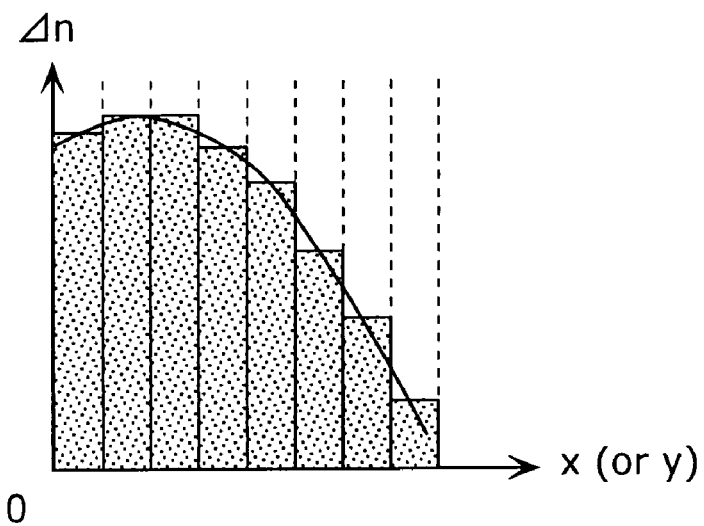
FIG. 33 is a diagram which shows a refractive index distribution of a lens according to the third embodiment

The change of the refractive index herein is shown in FIG. 33 and is asymmetric. The refractive index of the lens is the highest in the center part of the concentric circles and gradually decreases toward the edge. In other words, as the incident light 9 shown in FIG. 30, the refractive index distribution sensed by light incoming from a certain direction is asymmetric to the center of the distributed refractive index lens 1.

In general, the shape of the incident window region to which light enters is a quadrangle in accordance with the aperture of each pixel. In the case where the incident window region is in a circular, a clearance is created between lenses so that light leakage is occurred causing a big loss in light-condensing efficiency. However, when the incident window region is shaped into quadrangle, the incident light in an entire pixel region can be condensed. Therefore, the leakage light is not occurred reducing the light-condensing loss.

Figure 32:
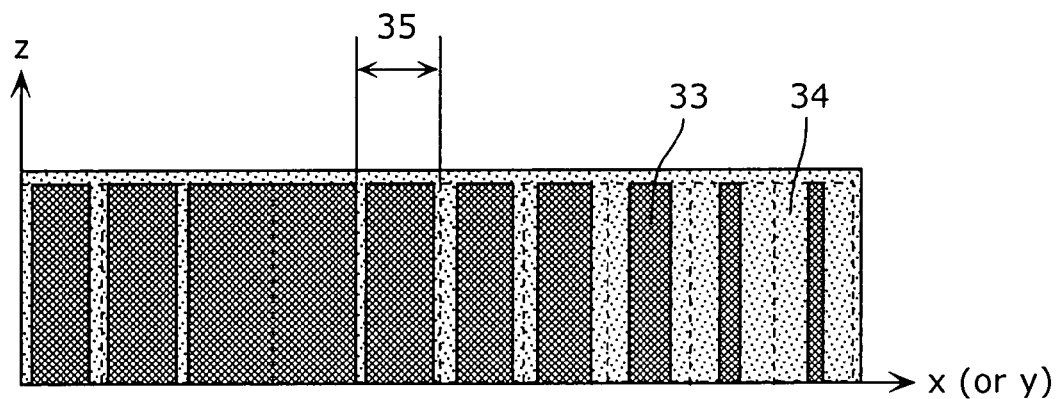
FIG. 32 is a diagram which shows a cross-section of a structure of the distributed refractive index lens according to the third embodiment.

FIG. 32 is a diagram which shows an example of a cross-section of the distributed refractive index lens 71. In a general distributed index lens, the highest refractive index is obtained in the optical center. In the present embodiment, the ring near the optical center is made of TiO₂ of the high refractive index material which is the first light transmitting film, and SiO₂ of the low refractive index material which is the second light transmitting film is embedded. When the ring cycle formed by the light-transmitting film is equal to or smaller than a wavelength of the incident light, the effective refractive index sensed by light can be calculated based on the volume ratio between the high refractive index material TiO₂ which is the first light-transmitting film and the low refractive index material SiO₂ which is the second light-transmitting film. The best characteristic of this structure is that the refractive index distribution can be freely controlled only by changing the combination of adjacent materials. In the present embodiment, in addition to the refractive index change caused by using materials having different refractive indexes, a refractive index change caused by changing the width of a structure in adjacent regions is also used. Consequently, the refractive index distribution having fine gradation can be realized and the light-condensing efficiency is increased.

Furthermore, whereas the present structure functions as a distributed refractive index lens even when being made only of the high refractive index material TiO₂ of the first light-transmitting film, there is a problem that dusts generated at the time of dicing processing which is a part of the manufacturing process are accreted to the space of the ring-shaped structure made of the high refractive index material TiO₂ of the first light-transmitting film. Since the accretion has a refractive index, the functionality of the refractive index lens is lowered. Furthermore, since there is a possibility that dusts in the air may also be accreted, it is significant that the space is embedded with the low refractive index material of the second light-transmitting film.

FIG. 33 shows a refractive index change of the distributed refractive index lens 71. The refractive index of the distributed refractive index lens 71 is the highest in the center part of the concentric circles and gradually decreases towards the edge. The parabola shows a refractive index distribution for condensing incident light with a wavelength λ (550 nm) in a focal length f (4.43 μm), and it is indicated by the equation (1).

It should be noted that, in the present embodiment, $\Delta n_{max}$ indicates a refractive index difference (in this case, 1.08) between the high refractive index material TiO₂ of the first light-transmitting film and SiO₂ of the low refractive index material of the second light-transmitting film. Although larger refractive index difference is preferred, the present embodiment can be realized with the value of 0.1 or higher.

Figure 34:
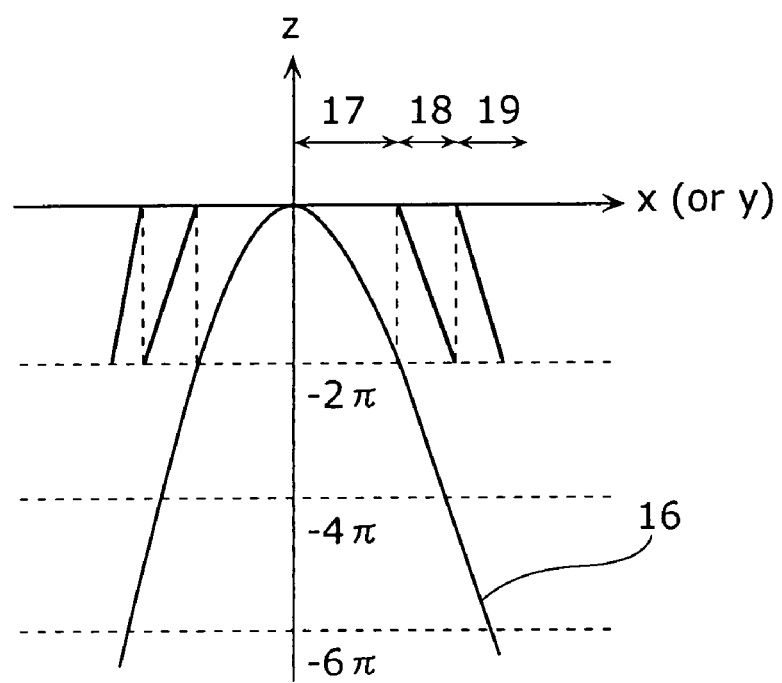
FIG. 34 is a diagram which shows a phase modulation of light according to the third embodiment.

In the present embodiment, the light propagation direction is controlled by performing phase-modulation of the incident light based on the refractive index distribution. Here, as shown in FIG. 34, the phase modulation obtained by the equation (1) is not only the first zone 17 but also a discontinuous phase modulation obtained by dividing the equation (1) by 2 π such as the second zone 18 and the third zone 19. However, since each zone is distinguished for one phase, effective phase modulation equals to the continuous phase modulation 16.

While it is designed as "the refractive index of the first light-transmitting film>the refractive index of the second light-transmitting film", it is possible to design as "the refractive index of the first light-transmitting film<the refractive index of the second light-transmitting film".

Furthermore, the structure in which the color filter is positioned on the top can be realized by embedding the first light-transmitting film into the second light-transmitting film.

Figure 35A:
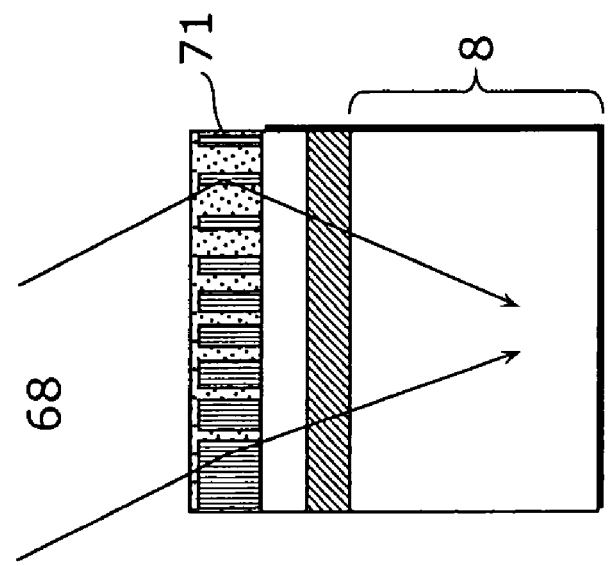
FIGS. 35A to 35C are diagrams, each of which shows a fundamental structure of one pixel according to the third embodiment.
Figure 35B:
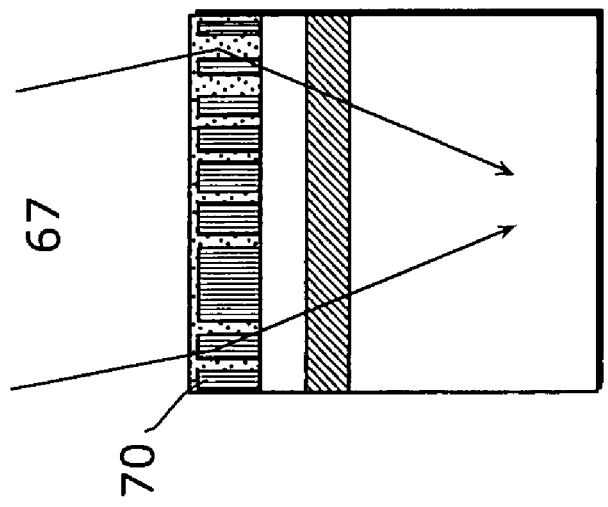
Figure 35C:
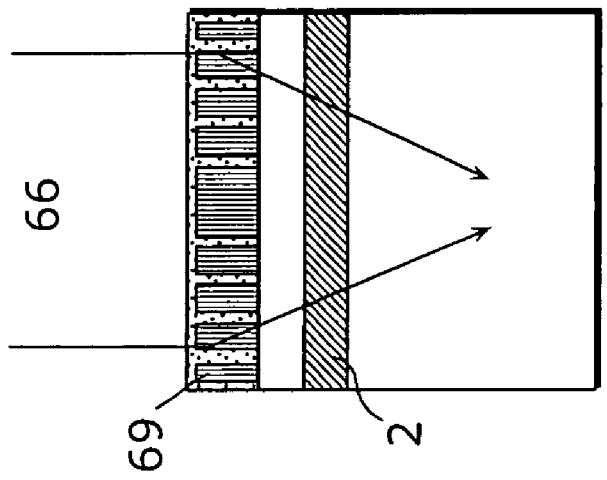

FIGS. 35A to 35C are diagrams, each of which shows a fundamental structure of one pixel according to the present embodiment. The lens according to the present pixel has a refractive index distribution of a single zone causing a phase modulation to the incident light. The light 66 incoming at the incident angle of 0°, light 67 incoming at the incident angle of α/2°, and light 68 incoming at the incident angle α° are respectively condensed by the distributed refractive index lens 69 for 0° incident light, the distributed refractive index lens 70 for α/2° incident light and the distributed refractive index lens 71 for α° incident light, pass through the respective color filter 2, and are converted into an electric signal by the respective light-receiving unit. Here, the angle α is defined by the following equation (3). Further, D indicates size of a pixel size.

$$\alpha = \sin^{-1}\left(\frac{n_1 D}{2n_0 f}\right) \quad (3)$$

In the distributed refractive index lens according to the present embodiment, a lens structure of each pixel can be optimized in accordance with the wavelength of incident light so that light can be high-efficiently condensed despite the difference in light-condensing efficiency due to the incident angle. In the distributed refractive index lens 69 for 0° incident light, whereas the center of concentric circles is positioned in the pixel center, the circle center shifts toward the light-incoming side as the incident angle increases.

Figure 36A:
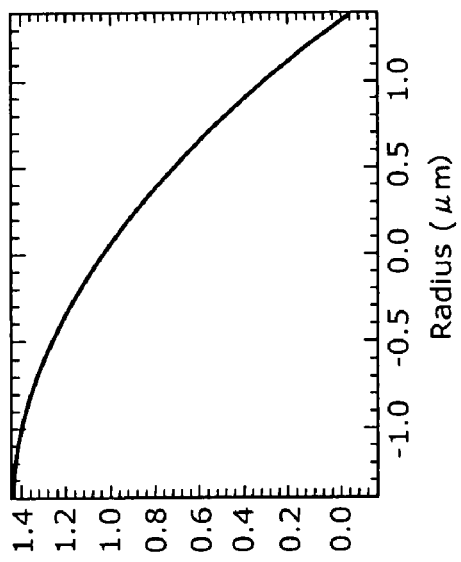
FIGS. 36A to 36C are diagrams, each of which shows a refractive index distribution of a lens according to the third embodiment
Figure 36B:
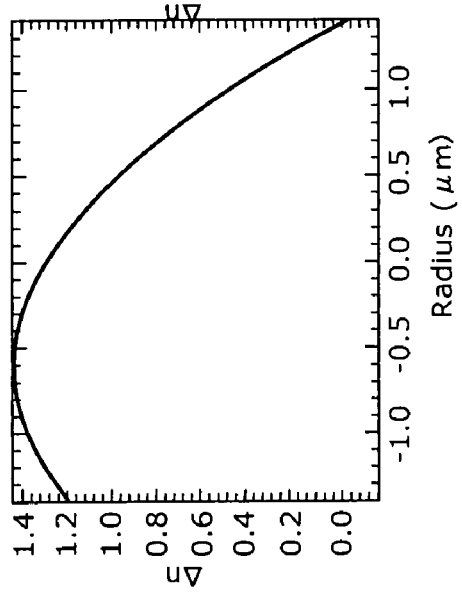
Figure 36C:
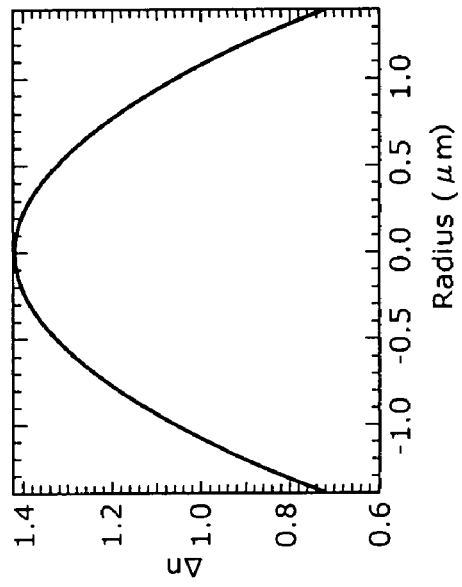
Figure 37A:
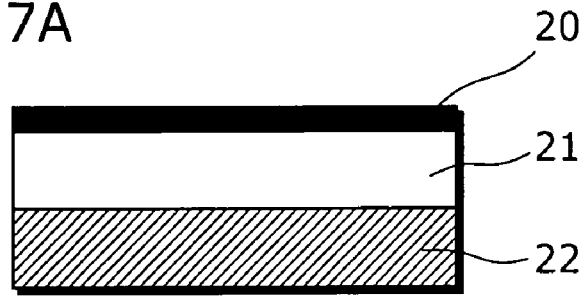
FIGS. 37A to 37D are diagrams, each of which shows a process of manufacturing a distributed refractive index lens according to the third embodiment.
Figure 37B:
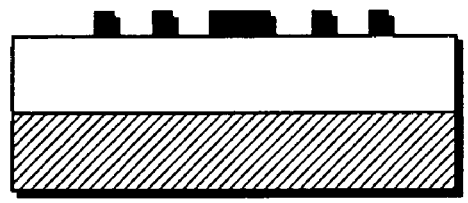
Figure 37C:
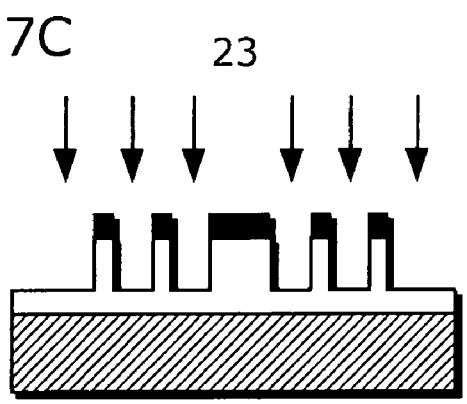
Figure 37D:
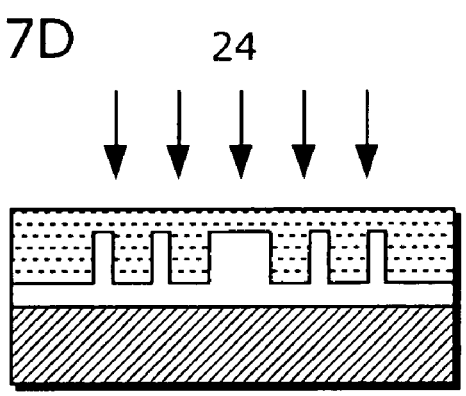

As shown in the aforementioned equation (1), this is because the maximum value of the secondary curve in the refractive index distribution shifts toward the light-incoming side as the incident angle θ increases (refer to FIG. 36).

In the case where the incident angle is equal to α° or smaller, the lens can be designed by a single zone while keeping a certain film thickness (for one phase). Herein, light is continuously introduced to the lens, the dispersion loss generated on the lens surface is decreased, and the light-condensing efficiency is increased. In order to set the incident angle at α° or greater, the film thickness may be further increased so as to extend the optical length (in order to increase the phase modulation).

Furthermore, the phase modulation differs depending on a wavelength of light to be phase-modulated. In the present embodiment, in the case where light of wavelength 0.45 µm, 0.55 µm, and 0.65 µm are respectively introduced into pixels having respective color lens structures, it is seen that all lens structures can obtain high light-condensing efficiency as much as 80 percent.

FIG. 37A to 37D are diagrams showing a process of manufacturing the distributed refractive index lens according to the present embodiment. The lens formation is performed by photolithography, etching and CVD. First, using a normal semiconductor process, a semiconductor integrated circuit 8 including a light-receiving element, wirings, a light-blocking layer, and a signal transmitting unit, and a color filter 2 are formed on the Si substrate 22 (not shown in FIG. 30). Each pixel is 2.8 µm square size and a light-receiving unit is 1.1 µm square size. After that, using the sputtering device, the $TiO_2$ film 21 is formed and resist 20 is applied on the $TiO_2$ film 21 (FIG. 8A). The thicknesses of the $TiO_2$ film and the resist are respectively 0.5 µm. Next, through the process of photolithography, a resist pattern having a concentric structure is formed (FIG. 8B). After that, the resist pattern is post-baked at 180° C. and etching 23 is performed on the post-baked resist pattern by dry etching (FIG. 8C). After removing the resist, $SiO_2$ is formed so as to embed the concentric structure by plasma CVD 24 (FIG. 8D). In the present embodiment, $SiO_2$ covers $TiO_2$, both $SiO_2$ and $TiO_2$ may be exposed by planarizing them using CMP and the like.

Figure 38:
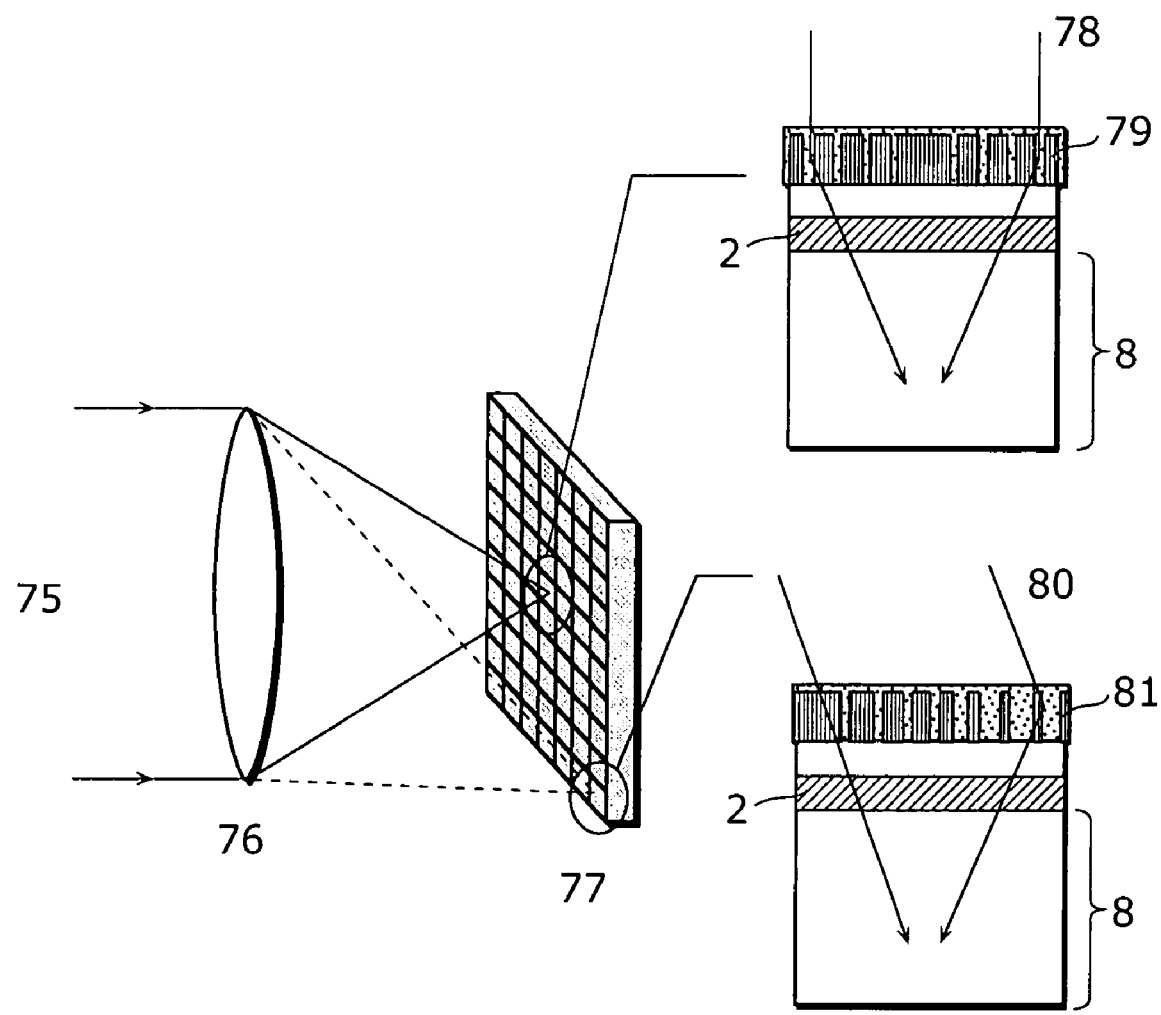
FIG. 38 is a diagram which shows a fundamental structure of pixel arrangement in the solid-state imaging apparatus according to the third embodiment.

FIG. 38 is a diagram showing a state of pixel arrangement in a solid-state imaging apparatus using VGA (310,000 pixels) according to the present embodiment. The signal light 75 is condensed by the optical lens 76 and is irradiated on the solid-state imaging apparatus 77 having distributed refractive index lenses. In a solid-state imaging apparatus in which the semiconductor integrated circuits 8, each of which includes a light-receiving element and wirings, and distributed refractive index lenses are arranged in a two-dimensional array, the incident angle of light differs for pixels located in a center part and for pixels located in a peripheral part. While the light enters at approximately 0° into the pixels in the center part, the light enters at the incident angle of approximately 30° into the pixels in the peripheral part. Accordingly, in the present embodiment, distributed refractive index lenses corresponding to the incident light component with the strongest light intensity that is incident on each pixel are formed from the center towards the peripheral of the solid-state imaging apparatus. Each distributed refractive index lens optimizes the lens structure depending on the position of a pixel in the imaging apparatus so that the light-condensing efficiency becomes the highest. It should be noted that the increase in light-condensing efficiency by shrinking characteristic of the semiconductor integrated circuit may be used at the same time.

Figure 39:
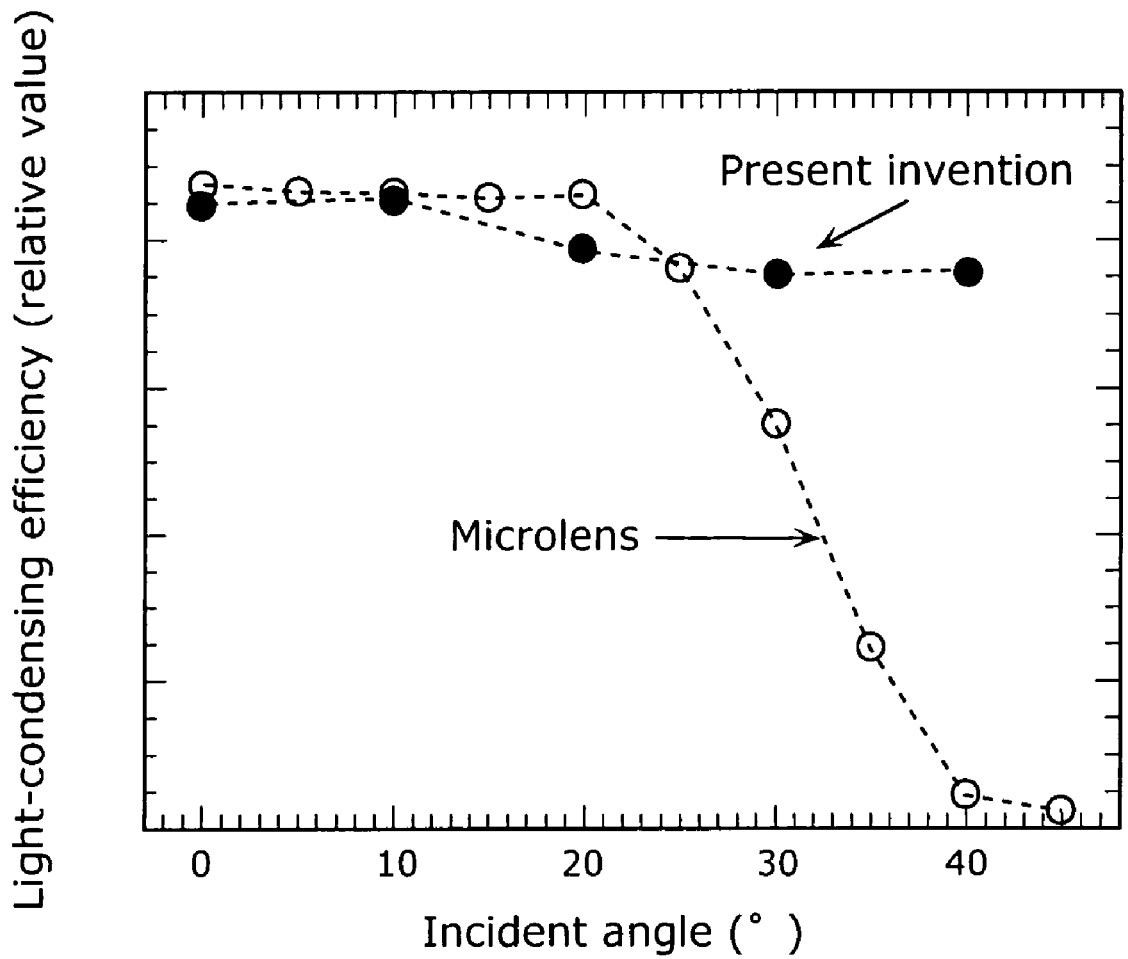
FIG. 39 is a diagram which shows dependency on incident angles of light-condensing efficiency of the solid-state imaging apparatus according to the third embodiment.

FIG. 39 is diagram which shows incident angle degree dependence of the light-condensing efficiency. The horizontal axis indicates an angle of light incident onto the solid-state imaging apparatus. Here, an angle of 0° indicates a center pixel and an angle of 30° or greater indicates a peripheral pixel. While the light-condensing efficiency of the solid-state imaging apparatus using microlenses rapidly decreases from around pixels of incident angle of 20°, the light-condensing efficiency is kept in 80 percent even in the peripheral pixel in the distributed refractive index lens according to the present invention. It is seen that the distributed refractive index lens of the present invention has a strong angle dependency of the incident angle, compared to the microlens. Consequently, a decrease in light-condensing efficiency along with the increase of incident angle can be moderated so that the present invention is expected for an application to a short-focal point optical system such as a camera for a cell phone.

The solid-state imaging apparatus according to the present invention can be used for a digital video camera, a digital still-camera, and a camera equipped cellular phone, and the like.

The invention claimed is:

1. A light-collecting device comprising an aggregate of light-transmitting films having different refractive indexes,
   wherein one light-transmitting film in said aggregate has a concentric circle shape with a predetermined thickness and a width which is equal to or smaller than a wavelength of incident light,
   another light-transmitting film in said aggregate concentrically fills all or a part of a space of said aggregate in which said one light-transmitting film is not positioned,
   in said aggregate, $\Delta n(x)=\Delta n_{max}[(Ax^2+Bx \sin \theta)/2\pi+C]$ is approximately satisfied, where θ is an incident angle of the incident light, $\Delta n_{max}$ is a maximum value of a difference between a refractive index of said aggregate and a refractive index of a light-incoming side medium, and A, B and C are predetermined constants, and where $\Delta n(x)$ is a difference between the refractive index of said aggregate and the refractive index of the light-incoming side medium, the difference depending on a distance x in an in-plane direction in said aggregate, and
   $\Delta n_{max} L=\lambda$ is approximately satisfied where L is a thickness of said aggregate and λ is a wavelength of the incident light.

2. The light-collecting device according to claim 1, wherein said one light-transmitting film is buried in said other light-transmitting film.

3. The light-collecting device according to claim 1, wherein an optical center of said aggregate is located at a position displaced from a center of said light-collecting device.

4. The light-collecting device according to claim 1, wherein a phase modulation Φ(x) depending on a distance x in an in-plane direction in said aggregate approximately satisfies the following equation, $$\Phi(x) = Ax^2 + Bx \sin\theta + 2m\pi$$

where m is a natural number.

5. The light-collecting device according to claim 1, wherein a difference between a refractive index of said one light-transmitting film and a refractive index of said other light-transmitting film is 0.1 or greater.

6. The light-collecting device according to claim 1, wherein the refractive index of said one light-transmitting film is a value in a range from 1.45 to 3.4.

7. The light-collecting device according to claim 1, wherein the refractive index of said one light-transmitting film is greater than the refractive index of said other light-transmitting film.

8. The light-collecting device according to claim 1, wherein the refractive index of said one light-transmitting film is smaller than the refractive index of said other light-transmitting film.

9. The light-collecting device according to claim 1, wherein a light-transmitting material for said one light-transmitting film or said other light-transmitting film is air.

10. The light-collecting device according to claim 1, wherein said one light-transmitting film or said other light-transmitting film further has, in a vertical direction, a multi-layered structure formed from light-transmitting materials having different refractive indexes.

11. The light-collecting device according to claim 1, wherein a light-transmitting material for said one light-transmitting film or said other light-transmitting film varies in type or arrangement depending on a wavelength of the incident light or a wavelength of a representative light of the incident light.

12. The light-collecting device according to claim 1, wherein a light-transmitting material for said one light-transmitting film or said other light-transmitting film varies in type or arrangement depending on a focal length set for the incident light.

13. The light-collecting device according to claim 1, wherein a shape of a cross section of said one light-transmitting film or said other light-transmitting film in a normal direction is rectangular.

14. The light-collecting device according to claim 1, wherein said one light-transmitting film or said other light-transmitting film is made of a light-transmitting material with a diameter which is equal to or smaller than the wavelength of the incident light.

15. The light-collecting device according to claim 1, wherein said one light-transmitting film includes one of $TiO_2$, $ZrO_2$, $Nb_2O_5$, $Ta_2O_5$, $Si_3N_4$ and $Si_2N_3$.

16. The light-collecting device according to claim 1, wherein said one light-transmitting film includes one of $SiO_2$ doped with B or P, that is Boro-Phospho Silicated Glass, and Teraethoxy Silane.

17. The light-collecting device according to claim 1, wherein said one light-transmitting film includes one of benzocyclobutene, polymethymethacrylate, polyamide and polyimide.

18. A solid-state imaging apparatus comprising:
unit pixels arranged in a two-dimensional array, each unit pixel including a light-collecting device which has an aggregate of light-transmitting films having different refractive indexes,
wherein one light-transmitting film in said aggregate has a concentric circle shape with a predetermined thickness and a width which is equal to or smaller than a wavelength of incident light,
another light-transmitting film in said aggregate concentrically fills all or a part of a space of said aggregate in which said one light-transmitting film is not positioned,
in said aggregate, $\Delta n(x) = \Delta n_{max}[(Ax^2 + Bx \sin\theta)/2\pi + C]$ is substantially satisfied, where θ is an incident angle of the incident light, $\Delta n_{max}$ is a maximum value of a difference between a refractive index of said aggregate and a refractive index of a light-incoming side medium, and A, B and C are predetermined constants, and where Δn(x) is a difference between the refractive index of said aggregate and the refractive index of the light-incoming side medium, the difference depending on a distance x in an in-plane direction in said aggregate, and
$\Delta n_{max}L = \lambda$ is substantially satisfied where L is a thickness of said aggregate and λ is a wavelength of the incident light.

19. The solid-state imaging apparatus according to claim 18, further comprising
a color filter positioned above said aggregate.

20. The solid-state imaging apparatus according to claim 18, further comprising
a color filter positioned below said aggregate.

21. The solid-state imaging apparatus according to claim 18,
wherein a type or an arrangement of a light-transmitting material of said light-transmitting film differs between (a) said one light-transmitting film or said other light-transmitting film of a unit pixel located in a center of said solid-state imaging apparatus and (b) said one light-transmitting film or said other light-transmitting film of a unit pixel located in a periphery of said solid-state imaging apparatus.

22. The solid-state imaging apparatus according to claim 18,
wherein said aggregate is formed so as to cover an entirety of a corresponding unit pixel.

23. A method of manufacturing a solid-state imaging apparatus, described in claim 18,
comprising
a process of forming the aggregate by nanoimprinting using a mold which has a minimum processing dimension of 1 nm or less.

24. A method of manufacturing a solid-state imaging apparatus described in claim 18,
said method comprising
a process of forming the aggregate by one of electron beam rendering and light beam rendering.

25. A method of manufacturing a solid-state imaging apparatus described in claim 18,
said method comprising
a process of forming the aggregate by autoagglutination of particles, each of which has a particle size which is equal to or smaller than a wavelength of the incident light.

* * * * *

UNITED STATES PATENT AND TRADEMARK OFFICE
CERTIFICATE OF CORRECTION

| | | |
|---|---|---|
| PATENT NO. | : 7,667,286 B2 | Page 1 of 1 |
| APPLICATION NO. | : 11/658666 | |
| DATED | : February 23, 2010 | |
| INVENTOR(S) | : Toshikiyo et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 363 days.

Signed and Sealed this

Twenty-eighth Day of December, 2010

David J. Kappos
*Director of the United States Patent and Trademark Office*